(12) United States Patent
Yamagata

(10) Patent No.: US 7,208,832 B2
(45) Date of Patent: Apr. 24, 2007

(54) SEMICONDUCTOR DEVICE, PACKAGE STRUCTURE THEREOF, AND METHOD FOR MANUFACTURING THE SEMICONDUCTOR DEVICE

(75) Inventor: Osamu Yamagata, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/865,730

(22) Filed: Jun. 10, 2004

(65) Prior Publication Data

US 2005/0017346 A1 Jan. 27, 2005

(30) Foreign Application Priority Data

Jun. 13, 2003 (JP) ............... 2003-168625

(51) Int. Cl.
*H01L 29/40* (2006.01)
(52) U.S. Cl. .............. 257/701; 257/701; 257/702; 257/723; 257/724
(58) Field of Classification Search ............... 257/701, 257/702, 723, 724, 686
See application file for complete search history.

(56) References Cited

U.S. PATENT DOCUMENTS

| 5,426,072 A * | 6/1995 | Finnila ............... 438/107 |
| 6,303,958 B1 * | 10/2001 | Kanaya et al. ........... 257/310 |
| 6,546,620 B1 * | 4/2003 | Juskey et al. ............ 29/840 |
| 6,803,324 B2 * | 10/2004 | Ogawa et al. ........... 438/761 |
| 2004/0041243 A1 * | 3/2004 | Ogawa .................. 257/668 |

FOREIGN PATENT DOCUMENTS

| EP | 0 836 229 | 4/1998 |
| EP | 1 061 577 | 12/2000 |
| FR | 2 336 024 | 7/1977 |
| JP | 1 218042 | 8/1989 |
| JP | 4 152695 | 5/1992 |
| JP | 4 354333 | 12/1992 |
| JP | 7 45787 | 2/1995 |
| JP | 2001 156457 | 6/2001 |
| JP | 2002 57279 | 2/2002 |
| JP | 2002 83894 | 3/2002 |
| JP | 2002 164468 | 6/2002 |
| WO | WO 03 028418 | 4/2003 |

* cited by examiner

*Primary Examiner*—Andy Huynh
*Assistant Examiner*—Thinh T Nguyen
(74) *Attorney, Agent, or Firm*—Frommer Lawrence & Haug LLP; William S. Frommer; Thomas F. Presson

(57) ABSTRACT

A semiconductor device includes a plurality of insulating layers laminated on a substrate to cover passive elements such as a capacitor, an inductor, and the like, and to fix an IC chip in a face up state in one of the insulating layers. The insulating layers have similar structures in each of which the passive element or the semiconductor chip is disposed in at the bottom, a plug is formed in the insulating layer to pass therethrough in the thickness direction for extending an electrode of one of these elements to the top surface, and a conductive layer is provided as wiring on the top surface of the insulating layer to be connected to the plugs for electrically connecting respective elements or rearranging the electrode position. Also, an insulating layer is provided on the top for protecting the semiconductor device and for providing an external connecting electrode.

11 Claims, 14 Drawing Sheets

GRINDING

Related Art

Related Art

SEMICONDUCTOR DEVICE, PACKAGE STRUCTURE THEREOF, AND METHOD FOR MANUFACTURING THE SEMICONDUCTOR DEVICE

BACKGROUND OF THE INVENTION

1. Field of the Invention

The present invention relates to a semiconductor device comprising an active element such as a semiconductor chip, and a passive element such as a capacitor, these elements being mounted on a common substrate. The present invention also relates to a package structure of the semiconductor device, and a method for manufacturing the same.

2. Description of the Related Art

Recently, electronic apparatuses have been required to have carrying convenience and high performance with the popularization and advance of portable electronic apparatuses such as cellular phones and the like, and semiconductor devices used for such electronic apparatuses have been also required to be small, lightweight and thin, or multi-functional and inexpensive.

Therefore, there have been strong demand for module products or package products manufactured by a small and high-density packaging technology. Also, many multi-chip module (MCM) products, system in package (abbreviated to "SiP" hereinafter) products, and the like have been developed. In each of these products, a semiconductor chip and a passive element necessary for realizing a desired function are integrated in a package by using any one of various substrate materials.

However, a silicon substrate has conductivity and allows a leakage current and an induced current to flow therethrough, and thus the silicon substrate cannot be used as, for example, a SiP substrate for a RF (radio frequency) circuit of radio equipment or the like. Therefore, in a SiP for a RF circuit, a ceramic substrate such as a LTCC (Low-Temperature Co-Fired Ceramic) substrate or the like, an organic material substrate such as a FR-4 (flame retardant grade of U.S. National Electrical Manufacturers Association) glass epoxy substrate or the like is used as the substrate, and electric connection to a semiconductor chip is generally performed by flip chip bonding or wire bonding.

FIG. 13 is a schematic sectional view showing an example of a SiP for a RF circuit using LTCC substrates. Each of LTCC substrates 61 is formed by firing a clay-like sheet (generally referred to as a "green sheet"), which comprises alumina containing a filler, at a relatively low temperature of about 600° C. to 700° C. In order to form a SiP, a plurality of green sheets is laminated, pressed and then fired, as shown in FIG. 13.

The LTCC substrate 61 has the advantage of high thermal conductivity, high strength and no curvature, and also has the advantage that a passive element can be formed by printed wiring. Namely, each of an inductor 62 and a wiring portion 65 can be formed on the substrate by printing a printing paste comprising silver, tungsten, or the like on a green sheet. Also, a ceramic is a dielectric material, and thus each of capacitors 63 and 64 can be formed by forming electrodes opposing each other with a ceramic layer provided therebetween. Furthermore, a connecting portion 66 passing through the substrate can be formed by filling a printing paste in a hole (through hole) drilled in a green sheet.

However, the SiP using the LTCC substrates has the following problems 1 to 6:

1. Each of the layers cannot be sufficiently thinned (about 25 μm minimum, and usually about 50 μm). Thus, a SiP laminate cannot be easily thinned.

2. Connection to semiconductor chips 67 and 68 can be performed only by flip chip bonding or wire bonding. The flip chip bonding requires a space for filling an underfill material 69, and the space projects from the chip size in a planar direction to produce a region where another element cannot be disposed. The wire bonding requires a space for providing a wire. Any one of the bonding methods is difficult of compact packaging.

3. The semiconductor chips cannot be buried in a ceramic layer because firing is performed. Therefore, the semiconductor chips must be fixed to the top of the substrate as described above, and thus a protective material is required to increase the size.

4. A pattern can be formed only by printing.

5. The laminated ceramic layers must have the same degree of thermal expansion coefficient, and thus the same material must be used for the ceramic layers.

6. As a result, the dielectric constant of each layer is limited to cause difficulty in changing the dielectric constant with the layers, thereby limiting the capacitance.

7. The cost is increased.

On the other hand, 14A is a schematic sectional view of an example of a RF SiP using a glass epoxy substrate such as the FR-4 substrate or the like. Although a glass epoxy substrate 71 can easily be processed by drilling or laser boring, the substrate 71 has a thickness of as large as about 150 μm and a low dielectric constant, thereby causing the problem of failing to form a capacitor by using the substrate itself (but, an inductor 72 can be incorporated). Therefore, like in the LTCC substrate, a user connects a semiconductor chip 77 to the substrate by flip chip bonding or wire bonding, and connects a passive element 78 such as a capacitor or the like to the substrate by solder bonding (wireless bonding), thereby causing difficulty in compact packaging.

As shown in FIG. 14B, there has been a study of burying of en electronic component in a glass epoxy substrate. However, the electronic component has a large thickness, and thus the thickness of a layer in which the electronic component such as a semiconductor chip or the like is buried reaches 400 μm to 600 μm, thereby failing to decrease the thickness of the whole SiP and making it difficult to satisfy the requirement for thinning of a mobile product or the like.

Therefore, a method of thinning the buried semiconductor chip to decrease the whole thickness has been studied. However, a conventional method for thinning a semiconductor chip comprises grinding a support substrate, and thus requires new apparatuses other than an apparatus for bonding a back grind protecting tape, such as an apparatus for bonding to the support substrate, and an apparatus for separating the tape. Also, the number of the materials used is increased to increase the material cost and the SiP cost.

A method for precisely fixing a semiconductor chip in a face up state has an accuracy limit of 15 μm in a case of flip chip bonding, and an accuracy limit of 35 μm in a case of wire bonding (refer to Japanese Unexamined Patent Application Publication Nos. 2-150041, 5-343449, and 11-26481). For a laser light emitting element, a die bonder for realizing an accuracy of about 5 μm has been developed. However, the die bonder cannot be used for a large-diameter wafer or substrate because the tact time is long, and the accuracy is adversely affected by heat.

A possible method comprises mounting a semiconductor chip in a face up state on a silicon substrate having high reliability, burying a passive element in an insulating layer to mount it on the silicon substrate, and then forming wiring between the elements. However, this method has difficulty in thinning and miniaturization in any one of the planar direction and the height direction because there is now no bonding method other than flip chip bonding and wire bonding.

On the other hand, for the semiconductor chips, it has been proposed that the semiconductor chips are separately produced and integrated by an interlayer insulating film or the like, for realizing compact packaging and good circuit characteristics (refer to Japanese Unexamined Patent Application Publication Nos. 2001-298149 (pages 4 to 6 and FIGS. 1 and 13), and 2001-189424 (pages 6 to 10, and FIGS. 2, 4, 6 and 8)).

For example, Japanese Unexamined Patent Application Publication No. 2001-298149 discloses a semiconductor device comprising a semiconductor substrate, a circuit having a predetermined function and at least one recess which are formed on the semiconductor substrate, a semiconductor chip previously formed and buried in the recess, and an insulating layer for filling in a step between the semiconductor substrate and the semiconductor chip. This document also discloses a method according to an embodiment comprising forming contact holes in the insulating layer at necessary positions, and then bonding integrated circuits on the semiconductor chips with metal wiring of aluminum or the like. Japanese Unexamined Patent Application Publication No. 2001-189424 discloses various arrangement methods for laminating and mounting a plurality of semiconductor chips in a face up state.

However, in any one of these methods, no consideration is given to the manufacture and mounting of a passive element. In the invention of Japanese Unexamined Patent Application Publication No. 2001-298149, all semiconductor chips are mounted on one substrate, and there is thus the problem of increasing the substrate area as the number of the semiconductor ships mounted on the substrate increases. On the other hand, the invention of Japanese Unexamined Patent Application Publication No. 2001-189424 is aimed only at mounting about 2 to 3 semiconductor chips with a high density, and thus another substrate is required for mounting stacked semiconductor chips.

SUMMARY OF THE INVENTION

In consideration of the above-described situation, it is an object of the present invention to provide a packaged semiconductor device which contains, with a high density, an active element such as a semiconductor chip, and a passive element such as a capacitor, and which is capable of being small, thin, lightweight, inexpensive and multifunctional, and also provide a package structure of the semiconductor device, and a method for manufacturing the same.

A semiconductor device of the present invention comprises a plurality of insulating layers formed on a substrate, a face-up active element (for example, a semiconductor chip) and a face-up passive element (for example, a capacitor, an inductor, or a resistor), each of the active element and the passive element being covered with one of the insulating layers, and wiring formed on one of the insulating layers so that the active element and/or the passive element is connected to the wiring through the one of the insulating layers. A method for manufacturing the semiconductor device comprises a step of forming an insulating layer to cover the active element, a step of forming an insulating layer to cover the passive element, and a step of forming the wiring on an insulating layer so that the wiring is connected to the active element and/or the passive element through the insulating layer.

A package structure of the semiconductor device of the present invention comprises the semiconductor device buried in an insulating layer, and an external connecting electrode formed on the insulating layer.

In the present invention, each of at least the face-up active element and passive element is covered with one of the insulating layers formed on the substrate, and the active element and/or the passive element is connected to the wiring formed on one the insulating layers through the one of the insulating layers. Therefore, each of the active element and the passive element can be buried in the insulating layer while forming necessary electric connection, and, for example, a plurality of the insulating layers can be laminated with adhesive force between the respective insulating layers so that the semiconductor device having a desired function can be packaged to form a package having as small a thickness as possible and being protected with the insulating layers.

Namely, it is possible to sufficiently utilize the various functions of the insulating layers, i.e., the function to adhere a conductor to a surface or a through hole surface and form the active element or the wiring, the function to cover the active element and the passive element to maintain these elements at predetermined positions while protecting the elements from the mechanical, chemical or electrical adverse effect of the outside, the function to easily form a thin film and easily form a laminated structure only by the adhesive force between the respective insulating layers, and the like. Thus, the function to package the elements with a high density and protect the elements, which is conventionally served by a circuit board and a molding resin, can be realized only by the insulating layers. Therefore, the semiconductor device of the present invention becomes a small, thin, lightweight and inexpensive SiP, and the active element is held in a face up state, thereby permitting any desired wiring having a small width and pitch on the insulating layers. Therefore, the degree of design freedom can be increased, and the number of the insulating layers laminated can be increased to facilitate the formation of a multifunctional device containing various elements.

The manufacturing method of the present invention is capable of manufacturing the semiconductor device of the present invention with high reproducibility. The package structure of the present invention can facilitate mounting of the semiconductor device together with another electric component on a circuit board or the like.

DESCRIPTION OF THE PREFERRED EMBODIMENTS

Figure 1A:
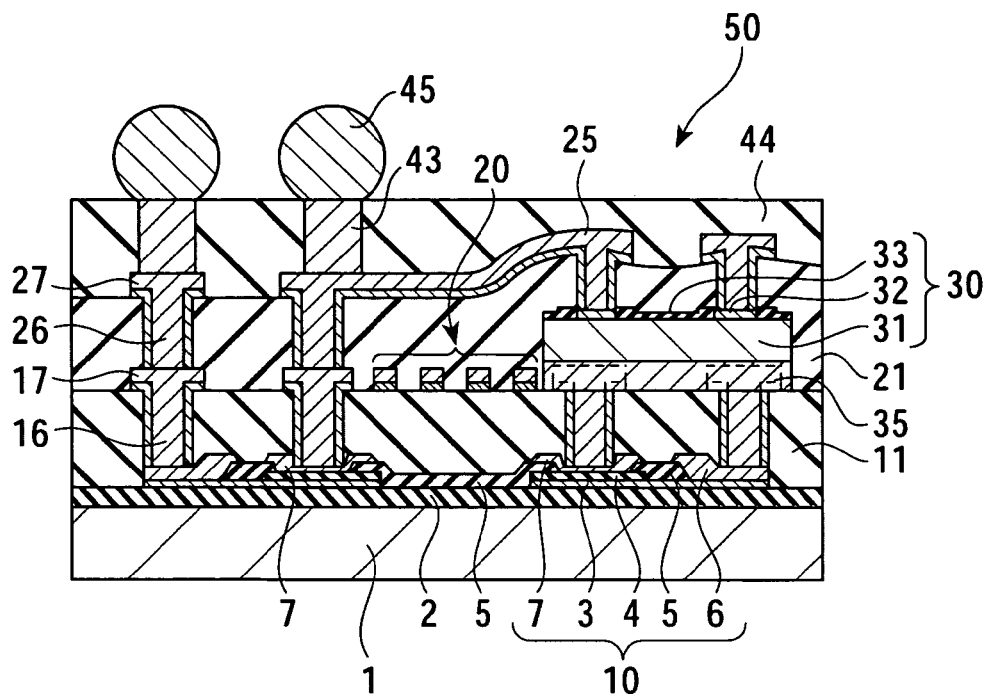
FIGS. 1A and 1B are schematic sectional views showing an example of a SiP (System in Package) according to a preferred embodiment of the present invention.

In the present invention, preferably, an insulating layer is formed on wiring, and an external connecting electrode is provided on an insulating layer. Also, the wiring is preferably formed on a lower insulating layer, and the external connecting electrode is preferably formed on an upper insulating layer.

Furthermore, a conductor is preferably formed in each of connecting holes formed in the insulating layers, for connecting the active element and/or the passive element to the wiring. A detail description will be made below.

A semiconductor device of the present invention usually has a structure comprising a laminate of a plurality of insulating layers. The insulating layers have similar structures in each of which a passive element or a semiconductor chip is formed or fixed at the bottom, a conductor plug formed in the insulating layer to pass therethrough in the thickness direction for extending an electrode of each of the elements disposed at the bottom to the top surface of the insulating layer, and wiring or the like is provided at the top surface of the insulating layer to be joined to the conductor plug for electrically connecting the elements or re-arranging the electrode position. This structure can be realized by flip chip mounting of the semiconductor chip in a face-up state.

Specifically, each insulating layer may be patterned in correspondence with the conductor plugs and the wiring, and the formed pattern may be filled with copper or the like by plating to form the conductor plugs and the wiring.

An inductance element can be formed as a part of the wiring.

The laminated structure is not particularly limited, and there are various possible structures. Examples of a semiconductor device having such a laminated structure include a semiconductor device comprising a first passive element (for example, a capacitor) covered with a first insulating layer, and a second passive element (for example, an inductor) and a semiconductor chip covered with a second insulating layer formed on the first insulating layer; a semiconductor device comprising a first passive element and a semiconductor chip covered with a first insulating layer, and a second passive element covered with a second insulating layer formed on the first insulating layer; a semiconductor device comprising a first passive element covered with a first insulating layer, a second passive element covered with a second insulating layer formed on the first insulating layer, and a semiconductor chip covered with a third insulating layer formed on the second insulating layer; and the like. Namely, each of the semiconductor chip and the passive element is buried in one of the insulating layers while forming necessary electric connection, and the insulating layers are laminated to assemble a system having a desired function as a package.

In order to fix the semiconductor chip on the substrate, the semiconductor chip may be positioned by observing both a alignment mark on the substrate or the insulating layer and the electrode of the semiconductor chip in the same visual field of, for example, a CCD (Charge Coupled Device) camera. In this case, a mounting accuracy of ±2.5 µm can be achieved.

When a plurality of the semiconductor chips is required, a plurality of the semiconductor chips is preferably laminated and fixed from the viewpoint of compactness of the whole structure.

In thinning the substrate, the back side of the substrate with the surface protected by a protective sheet is ground to separation grooves previously formed in the substrate from the surface side thereof, and thus the substrate is thinned and divided into individual pieces at the same time.

In dividing a semiconductor wafer into pieces as semiconductor chips, preferably, the back side of the semiconductor wafer opposite to the electrode surface covered with a protective sheet is ground to thin the semiconductor wafer, and then the semiconductor wafer covered with the protective sheet is bonded to a dicing sheet. Then, after the protective sheet is removed, the semiconductor wafer is preferably diced to obtain the semiconductor thin chips, and each semiconductor chip is fixed to the substrate. In this case, a material such as a support substrate for grinding and some processing apparatuses are made unnecessary to decrease the thinning cost.

The substrate is preferably a silicon substrate. Although a support member is necessary for forming the insulating layers, the silicon substrate is optimum as the support member. The silicon substrate has not only excellent mechanical strength, heat resistance, thermal conductivity, flatness, micro-fabrication property, and the like, but also the advantage that the techniques and apparatuses accumulated in the long history of semiconductor processing can be utilized. For example, a large material having excellent flatness can be obtained, and a fine pattern can easily be formed. Also, the silicon substrate can easily be thinned by the above-described grinding. Furthermore, if required, the substrate can also be used as a material for forming an active element, not simply as the substrate.

As a material for the insulating layers, photosensitive polyimide is preferably used. The polyimide is a structural material not only having excellent heat resistance, mechanical strength, and the like, but also having excellent electric properties such as a low dielectric constant, high insulation performance, and the like. Furthermore, an insulating layer comprising the photosensitive polyimide can easily be patterned by exposure and development in correspondence with the conductors and the wiring.

In a package structure of the semiconductor device, the semiconductor device is preferably mounted on an insulating layer together with other functional components. For example, a component such as a quartz oscillator which cannot be incorporated into the semiconductor device or which is disadvantageous in incorporation into the semiconductor device may be mounted together with the semiconductor device on, for example, a FR-4 grade glass epoxy substrate or the like.

Next, a preferred embodiment of the present invention will be described in detail below with reference to the drawings.

Semiconductor Device (SiP)

Figure 1B:
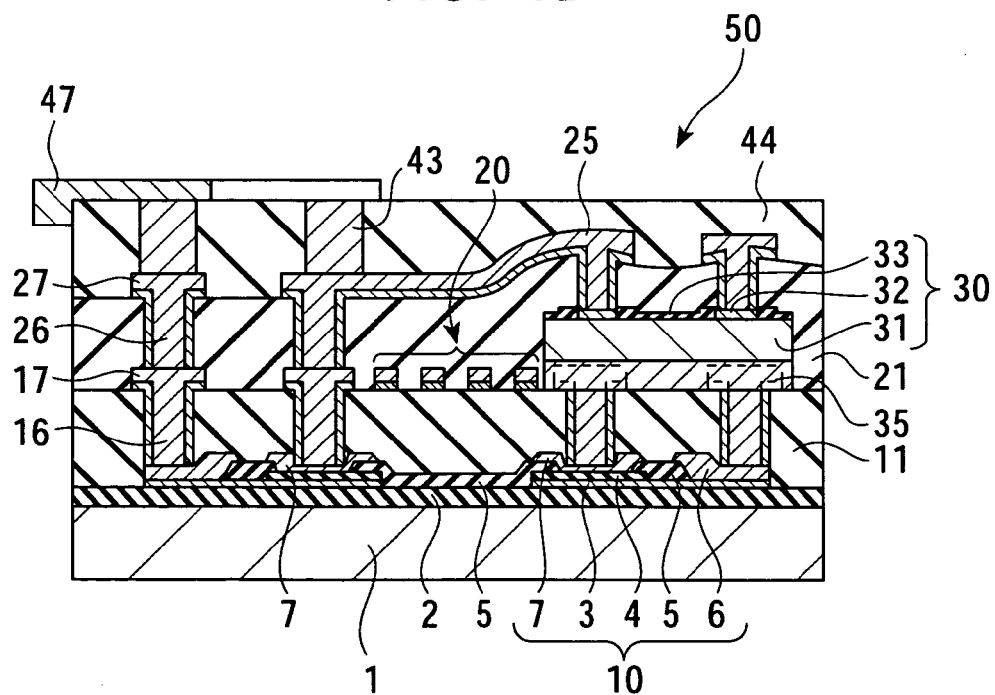

FIGS. 1A and 1B are schematic sectional views showing an example of a semiconductor device (System in Package, referred to as "SiP" hereinafter) according to a preferred embodiment of the present invention.

In the SiP, a capacitor 10 is covered with and buried in a first insulating layer 11, an inductor 20 and an IC chip 30 serving as a semiconductor chip are covered with and buried in a second insulating layer 21 formed on the first insulating layer 11. Furthermore, an insulating layer 44 is laminated at the top of the SiP to function as a buffer layer for controlling connections between internal electrode positions and wiring of the SiP and electrode positions of an external apparatus while protecting the inside of the SiP.

Although the SiP can be formed by using a single insulating layer and the surface of the substrate as a wiring formation region, such a structure as shown in FIGS. 1A and 1B comprising a plurality of insulating layers is preferred for making a compact planar size while realizing various functions.

The insulating layers have similar structures in each of which a passive element or a semiconductor chip is formed and fixed at the bottom, conductor plugs 16 or 26 are formed in the insulating layer to pass therethrough in the thickness direction for extending electrodes of each of the elements disposed at the bottom to the top surface of the insulating layer, and a conductive layer 25 is provided at the top surface of the insulating layer to be joined to the conductor plugs 16 or 26 for electrically connecting the elements or re-arranging the electrode positions. This structure can realize chip mounting of the semiconductor chip 30 in a face up state. Although each plug comprises a laminate of a seed layer and an electrolytically plated layer and formed by the method described below, the seed layer is not shown in FIGS. 2, 3A and 3B.

Each of the portions will be described in detail below.

In the SiP, a silicon substrate 1 is used, and a silicon oxide film 2 is deposited as an insulating layer having a thickness of 4000 Å or more on the surface of the silicon substrate 1. The silicon substrate 1 is thinned to 50 µm by grinding. As the substrate, a glass substrate or ceramic substrate other than the silicon substrate may be used.

Furthermore, a lower electrode 3 (an aluminum or copper thin film having a thickness of about 1 µm), a dielectric layer 4, a protective layer 5 (a silicon oxide film or silicon nitride film) for the dielectric layer 4, and an extension electrode 6 and an upper electrode 7 (an aluminum or copper thin film having a thickness of about 1 µm) for the lower electrode 3 are successively laminated on the silicon oxide film 2 to form the capacitor 10.

A material for the dielectric layer 4 is selected from tantalum oxide $Ta_2O_5$, BST (barium strontium titanate $Ba_xSr_{x-1}TiO_3$), PZT (lead zirconate titanate $PbZr_xTi_{x-1}O_3$), barium titanate $BaTiO_3$, silicon nitride SiN, PI (polyimide), silicon oxide $SiO_2$, and the like in consideration of the capacitance and breakdown voltage of the capacitor 10.

For example, in order to form the capacitor 10 with 0.1 pF to 40 pF, tantalum oxide $Ta_2O_5$ is used. In this case, with a thickness of 40 nm, the unit capacitance is about 7 fF/µm², and the breakdown voltage is about 4V with a current density of 1 µA/cm².

The SiP of this embodiment is excellent in that the dielectric material can be selected from many materials, and capacitors having various capacitances and breakdown voltages can be formed, as compared with a conventional method using a LTCC substrate.

The insulating layer 11 is provided over the capacitor 10, for covering the capacitor 10 and forming a conductive layer for the inductor 20 and the like on the capacitor 10.

The thickness of the insulating layer 11 is 50 µm or more so as to prevent a decrease in the Q value of the inductor 20 due to a current which is induced in the silicon substrate 1 by the current flowing through the inductor 20. The Q value represents an amount indicating the sharpness of resonance in enforced vibration and is an importance index showing the performance of the inductor.

A material for the insulating layer 11 may be a material with a low dielectric constant, for example, polyimide (PI), polybenzoxazole (PBO), an epoxy resin, or a polyamide imide resin which has a dielectric constant of about 2.9 to 3.3.

The inductor 20, wiring (not shown in the drawing), and the lands 17 are formed on the insulating layer 11 by using a conductive layer. The lands 17 are connected to the electrodes 6 and 7 of the capacitor 10 through the plugs 16.

Furthermore, the IC chip 30 serving as a semiconductor chip is fixed to the top of the insulating layer 11 by using a die attach film (DAF). In order to effectively use the space, the IC chip 30 is overlapped with the lands 17 and the wiring.

The thickness of the IC chip 30 is decreased to, for example, 50 µm by grinding. When two or more IC chips are laminated and mounted, and particularly when the thickness is limited, the thickness of each the CI chips mounted is decreased to, for example, 25 µm.

Furthermore, the insulating layer 21 is provided over the inductor 20 and the IC chip 30 to cover these elements, and the conductive layer 25 is provided on the insulating layer 21, for forming an extension part of the IC electrode 32.

The conductive layer 25 also functions to rearrange the internal electrode positions of the SiP on the outside of the SiP so that a copper post 43 and an external connecting electrode 45 are provided on the conductive layer 25 at positions suitable for connection to an external apparatus. The insulating layer 44 is provided as the outermost layer of the semiconductor device, for protecting the inside and improving the outer shape and reliability of the SiP. The conductive layer 25, the copper post 43, the external connecting electrode 45 and the insulating layer 44 function as a buffer layer for improving connection reliability in mounting the SiP, for example, on a FR-4 mother substrate or the like.

For example, when the external connection electrode 45 comprises a solder bump, as shown in FIG. 1A, the position of the solder bump 45 coincides with the standard electrode position of an area array type or peripheral type BGA (Ball Grid Array) package. Also, the land 27 is provided on the conductive layer at a position corresponding to the external connection electrode 45.

FIG. 1B is a schematic sectional view of a SiP in which an external connection electrode comprises a land 47. In this case, the land 47 is connected to another electrode with a solder paste. The position of the land 47 coincides with the standard electrode position of a LGA (Land Grid Array) package. The other portions are completely the same as in the semiconductor device shown in FIG. 1A.

MODIFIED EXAMPLES

Although there are various possible modified examples depending upon various laminated structures, a description will be made of an example in which two IC chips are mounted. A method for mounting a plurality of chips is an important technique for mixed mounting of ICs, for example, an analogue IC and a digital IC, which are difficult to form a monolithic type, to form a multifunctional SiP.

In this example, two IC chips are laminated to permit compact mounting. This case has the problem with the method of forming connection between each of the chips and an electrode.

Modified Example 1

Figure 2:
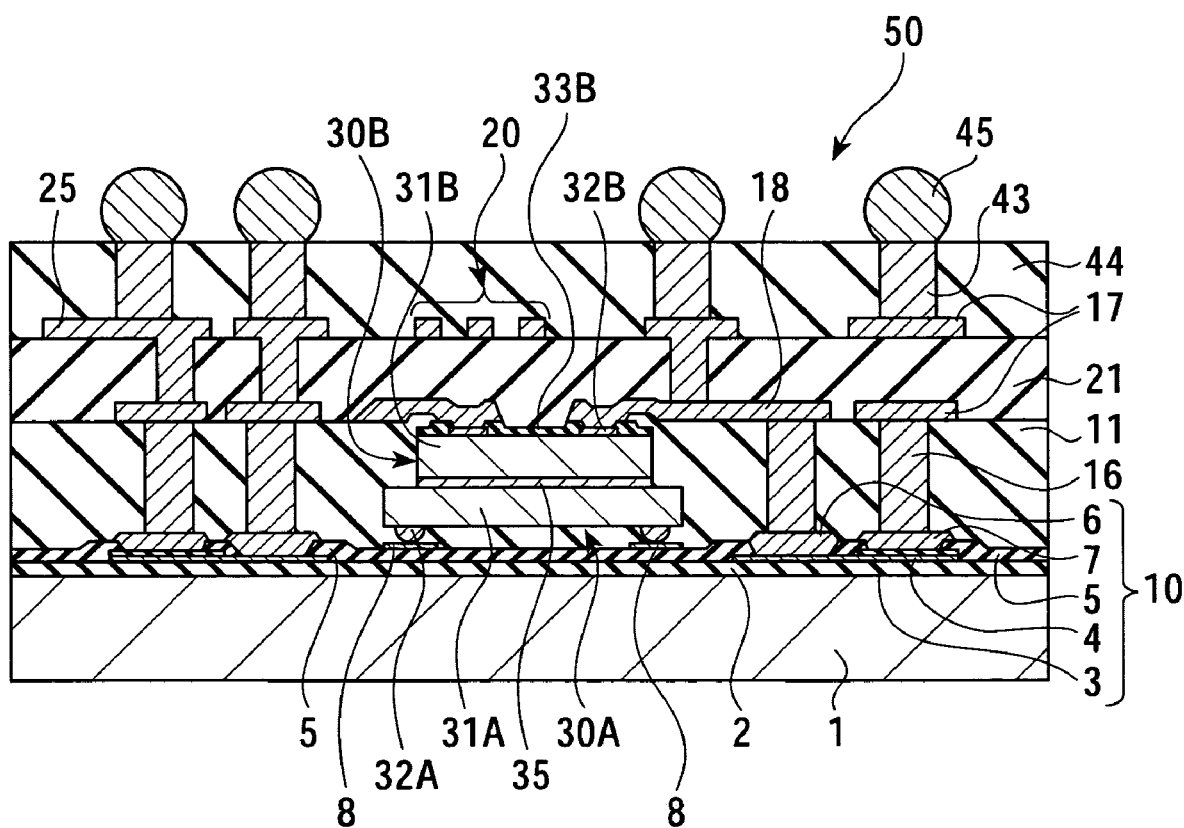
FIG. 2 is a schematic sectional view showing another example of the SiP.

FIG. 2 is a schematic sectional view of a SiP in which a lower IC chip 30A is mounted in a face down state on the substrate 1, and an upper IC chip 30B is laminated and mounted in a face up state on the IC chip 30A. In the laminated structure of this example, the capacitor 10 and the IC chips 30A and 30B are covered with the first insulating layer 11, main wiring is covered with the second insulating layer 21, and the inductor 20 is covered with the third insulating layer 44.

When the inductor layer 20 is formed in an upper layer, as in this example, the distance from the silicon substrate 1 inevitably becomes 50 µm or more, and thus the thickness of each of the insulating layers 11 and 21 need not be intentionally increased to 50 µm or more.

When the lower IC chip 30A is mounted in a face down state, a substrate-side electrode 8 connected to an IC electrode 32A and wiring thereof (not shown in the drawing) may be formed on a protective layer 5 during the formation of the electrodes 6 and 7 of the capacitor 10 on the silicon substrate 1. On the other hand, for bonding, a Ni/Au, UBM (Under Bump Metal) or Au stud bump or a solder bump is formed on the IC electrode 32A, and the substrate-side electrode 8 and the electrode 32A are bonded together after alignment between the substrate 1 and the IC chip 30A. Since the insulating layer 11 fills in a portion below the IC chip 30A, a so-called underfill material is unnecessary.

The IC chip 30B is press-bonded to the IC chip 30A with a die attach film (DAF) bonded to the electrode surface of the IC chip 30B at the bottom surface thereof, and fixed in a face up state.

Electric connection to the IC chip 30B mounted in a face up state is formed by the basic method according to the above-described embodiment. Namely, the insulating layer 11 is formed to cover and bury the IC chip 30B, and a plug is formed for extending the IC electrode 32B to the upper surface, and then a wiring portion 18 is formed on the upper surface of the insulating layer 11 to be electrically connected to the plug.

Modified Example 2

Figure 3A:
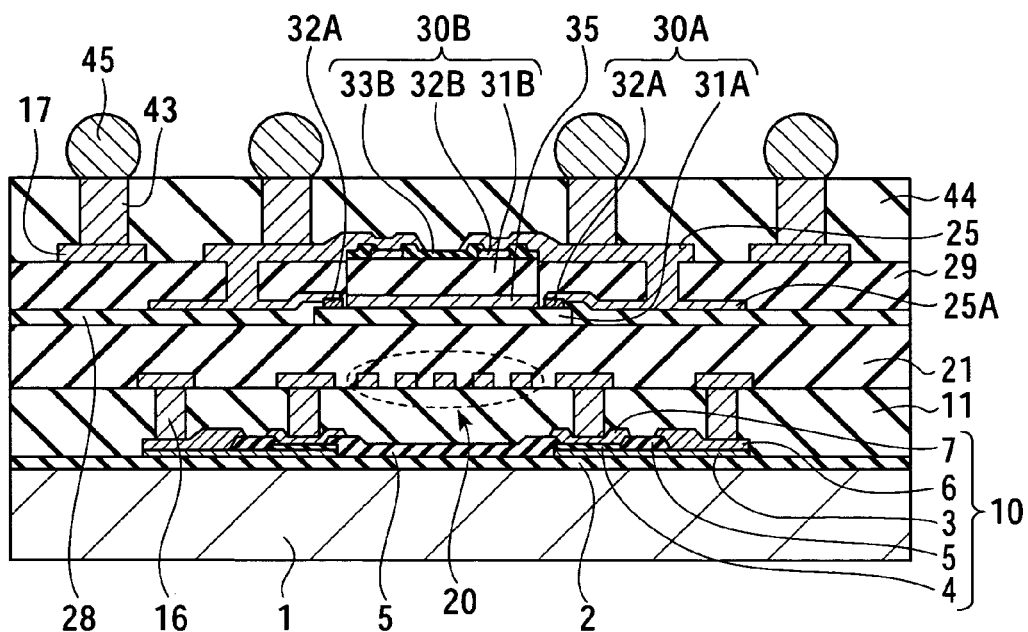
FIGS. 3A and 3B are schematic sectional views showing a further example of the SiP.
Figure 3B:
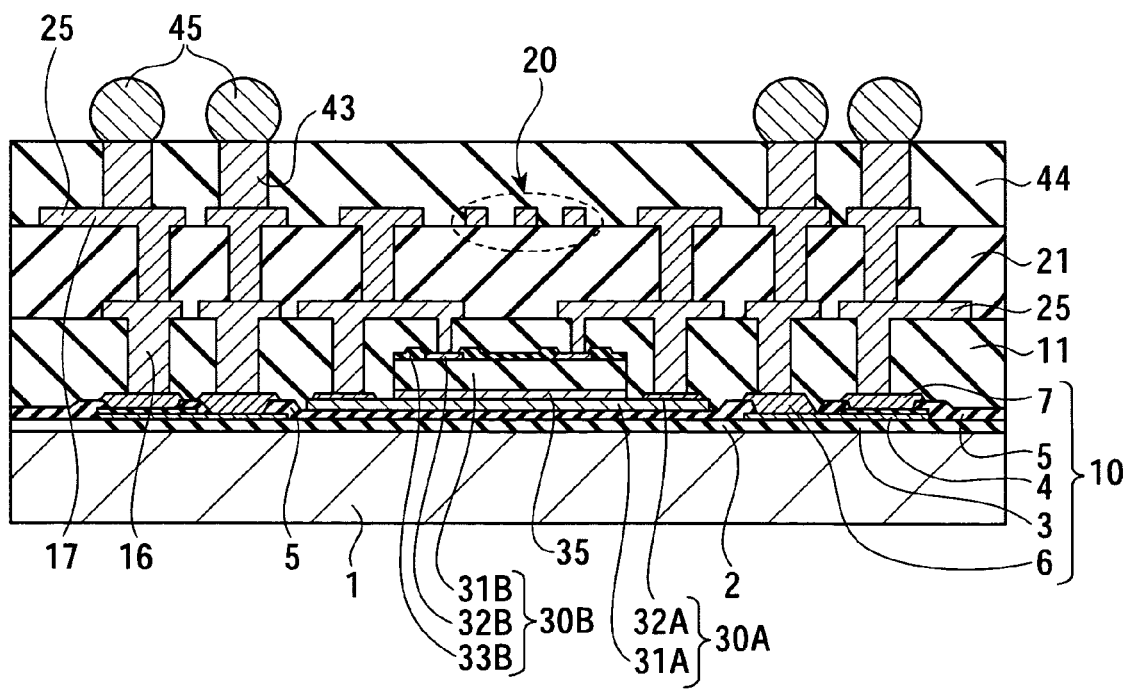

FIGS. 3A and 3B are schematic sectional views of a SiP in which both the lower IC chip 30A and the upper IC chip 30B are mounted a face up state. In this case, the wiring length between the upper and lower IC chips is shortened to decrease the wiring parasitic capacitance and resistance, thereby causing the advantage of a low transmission loss of a signal. There is no disadvantage.

FIG. 3A shows a laminated structure in which a capacitor 10 is covered with a first insulating layer 11, an inductor 20 is covered with a second insulating layer 21, the IC chips 30A and 30B are covered with a third insulating layer 29, and a conductive layer 25 is provided on the surface of the third insulating layer 29.

FIG. 3B shows a laminated structure in which a capacitor 10 and IC chips 30A and 30B are covered with a first insulating layer 11, and an inductor 20 is covered with a third insulating layer 44. This structure is suitable for a case in which wiring connected to the lower IC chip 30A need not be extended, as compared with the SiP shown in FIG. 3A.

Electric connection to the upper IC chip 30B is formed by the basic method of this embodiment comprising forming plugs in the insulating layer, which covers the IC chip 30B, to be connected to the IC electrodes 32B, and forming a conductive layer on the surface of the insulating layer.

When wiring to be connected to the IC chip 30A need not be separately provided, electric connection to the lower IC chip 30A is formed together with the electric connection to the upper IC chip 30B, as shown in FIG. 3B. When wiring to be connected to the IC chip 30A must be separately provided, as shown in FIG. 3A, an intermediate insulating layer 28 is formed to partially cover the lower IC chip 30A, and plugs connected to the IC electrodes 32A and an intermediate conductive layer 25A on the surface of the intermediate insulating layer 28 are formed by the basic method of this embodiment using the intermediate insulating layer 28.

Manufacture of Semiconductor Device (SiP)

An example of the process for manufacturing the SiP shown in FIGS. 1A and 1B will be described below in the order of steps with reference to the schematic sectional views of FIGS. 4A to 11C.

Figure 4A:
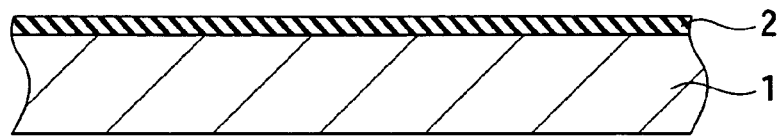
FIGS. 4A to 4D are schematic sectional views showing steps for manufacturing the SiP.

First, as shown in FIG. 4A, the silicon substrate 1 such as a polycrystal or single-crystal silicon wafer or the like (diameter: 8 inches, thickness: 725 µm resistivity: 1 to 20 Ω·cm), which has an orientation flat or notch is prepared, and the silicon oxide film 2 is deposited to a thickness of 4000 Å or more on the surface of the silicon substrate 1 by a CVD (Chemical Vapor Deposition) method or a thermal oxidation method. As the substrate, for example, a glass substrate or a ceramic substrate other than the silicon substrate can be used.

Formation of Capacitor

Figure 4B:
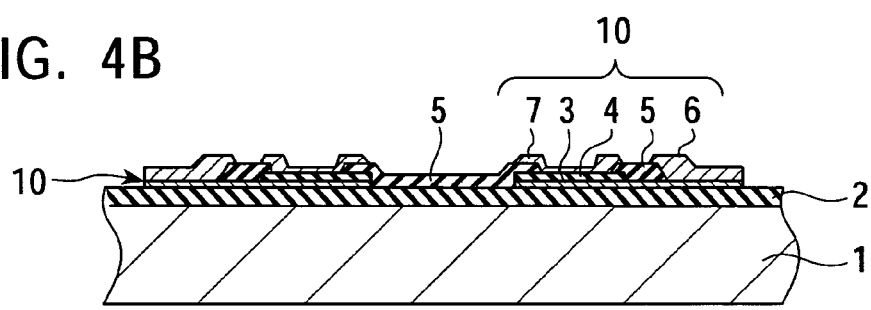

Next, as shown in FIG. 4B, the capacitor 10 is formed by a MIM-C (Metal Insulator Metal-Capacitor) process.

First, as the lower electrode 3, an aluminum or copper thin film is formed to a thickness of about 1 µm, for example, by a sputtering or vapor deposition method. Although not shown in the drawing, a titanium nitride film is formed to a thickness of 50 nm as an antioxidative film at a position of contact between the lower electrode layer 3 and the dielectric layer 4.

Next, the dielectric layer 4 is formed by a CVD process or sputtering process. A dielectric material is selected from tantalum oxide, BST, PZT, barium titanate, silicon nitride, polyimide, and silicon oxide, and the like in consideration of the capacitance and breakdown voltage of the capacitor 10.

For example, in order to form the capacitor 10 with 0.1 pF to 40 pF, a tantalum oxide $Ta_2O_5$ layer is used as the dielectric layer 4. In this case, with a thickness of 40 nm, a unit capacitance is about 7 $fF/\mu m^2$, and the breakdown voltage is about 4V with a current density of 1 $\mu A/cm^2$.

Furthermore, a silicon oxide film or silicon nitride film is formed as the protective layer 5 for the dielectric layer 4 by a CVD process, and an electrode leading window is formed by reactive ion etching (RIE). After the window is formed, an aluminum or copper thin film is formed in the window by a sputtering process or vapor deposition process to form the extension electrode 6 and the upper electrode 7 of the lower electrode 3, thereby completing the capacitor 10.

Formation of Inductor

Next, as shown in FIGS. 4C to 6A, the insulating layer 11 is formed, and a conductor pattern is formed on the insulating layer 10, for forming the inductor (L) 20 and the like.

Figure 4C:
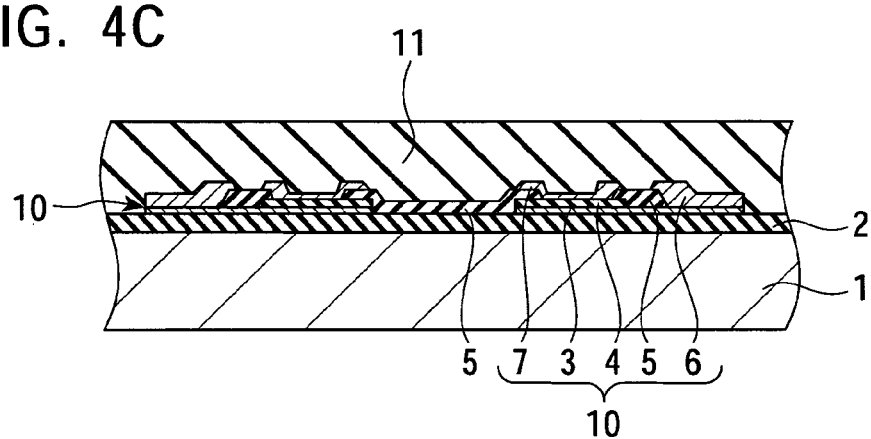

As shown in FIG. 4C, the insulating layer 11 is formed. The thickness of the insulation layer 11 is 50 μm or more so as to prevent an induced current from flowing through the silicon substrate 1 due to a current flowing through the inductor 20, thereby preventing a decrease in the Q value of the inductor 20.

A material for the insulating layer 11 may be a material with a low dielectric constant, for example, polyimide, polybenzoxazole, an epoxy resin, or a polyamide imide resin having a dielectric constant of about 2.9 to 3.3. The insulating layer 11 is formed by a spin coating process, a printing process, or a dispense process.

For example, when the insulating layer 11 is formed by a spin coating process using photosensitive polyimide, the insulating layer 11 having a thickness of 50 μm is formed under the following deposition conditions.

Viscosity of a coating solution: 200 P (poise);
Rotational speed of a spin coater: rotation at 800 rpm for 30 seconds, and then rotation at 1500 rpm for 30 seconds;
Pre-baking: heating at 90° C. for 300 seconds and then heating at 110° C. for 300 seconds in a nitrogen gas atmosphere.

Figure 4D:
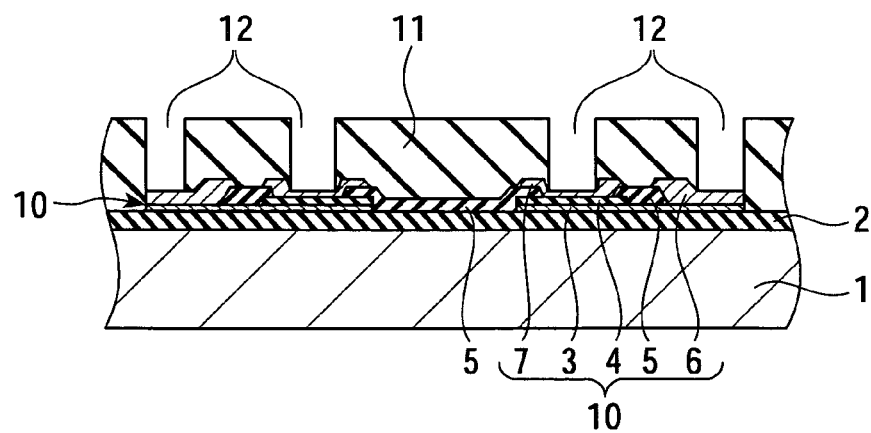

Next, as shown in FIG. 4D, holes having a diameter of, for example, 50 μm are formed as connecting holes (via holes) 12 in the insulating layer 11, for forming the plugs 16 connected to the electrodes 6 and 7 of the capacitor 10.

When the insulating layer 11 comprises photosensitive polyimide, the connecting holes (via holes) 12 are formed by exposure and development under the following conditions.

Exposure: irradiation of broadband light with 400 mJ/cm² in terms of i-line by using a stepper;
Development: spray development using a spin developer; J.E.T. (Just Exposure Time)×1.8;
Development test: using an inspection machine; and
Post-baking: heating at 150° C. for 0.5 hour and then heating at 250° C. for 2.0 hours in an atmosphere with an oxygen concentration of 40 ppm or less.

After development, a scum (remaining resist) on the surface of the insulating layer 11 is removed. The scum is removed by, for example, a plasma ashing apparatus for 10 minutes under the conditions of an oxygen flow rate of 100 sccm, and a RF power of 100 (to 300) mW.

Figure 5A:
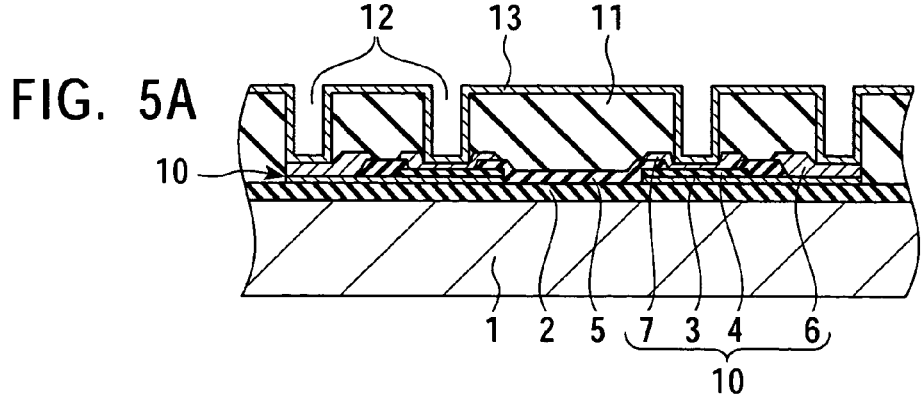
FIGS. 5A to 5D are schematic sectional views showing steps for manufacturing the SiP.

Next, as shown in FIG. 5A, a laminated film of a titanium film and a copper film is formed as the seed layer (underlying metal layer) 13 by sputtering.

Sputtering is performed under the following conditions:
Thickness: a titanium film of 1600 Å in thickness is deposited, and then a copper film of 6000 Å in thickness is deposited on the titanium film;
Degree of vacuum: $3.6 \times 10^{-3}$ Pa;
Sputtering pressure: $6.1 \times 10^{-1}$ Pa;
Argon gas flow rate: 110 to 115 cm³/min; and
Sputtering power: 2000 to 3000 W.

The seed layer (underlying metal layer) 13 may be formed by an electroless plating process.

Figure 5B:
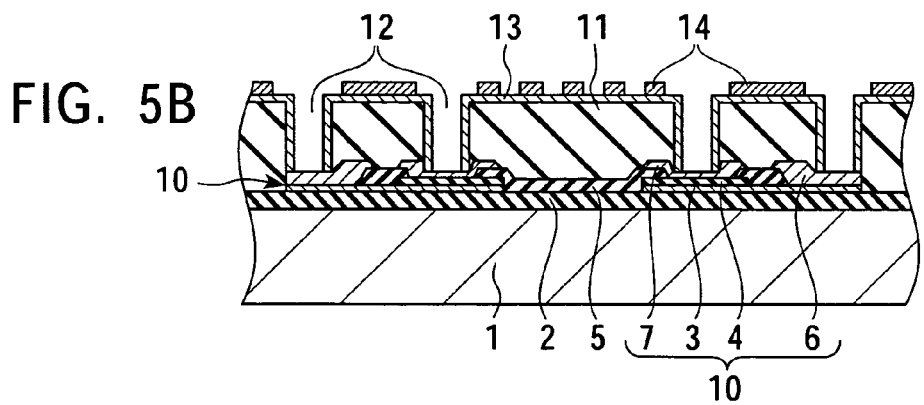

Next, a photoresist is coated, exposed in correspondence with the conductor pattern of the inductor 20 and the like, and then subjected to development and scum removal to form a resist pattern 14 corresponding to the conductor pattern, as shown in FIG. 5B.

For example, the resist is coated by a spin coating method, and then developed under the following conditions to form the resist pattern 14.

Rotational speed of a spin coater: rotation at 500 rpm for 10 seconds, rotation at 4000 rpm for 30 seconds, further rotation at 5000 rpm for 0.5 second, and then gradual speed reduction to a stop over 3 seconds;
Development: using a developer P-7G as a spin developer in 7 times of treatments each comprising rotating the substrate 1 at 50 rpm for 3 seconds while spraying the developer on the substrate 1, and then stopping rotation for 30 seconds;
Rinsing: spraying pure water on the substrate 1 for 60 seconds while rotating the substrate 1 at 500 rpm;
Spin drying: rotating the substrate 1 at 3000 rpm for 30 seconds to shake off water; and
Development test: using an inspection machine.

After the resist pattern 14 is formed, a scum on the surface is removed. The scrum is removed by, for example, using a plasma ashing apparatus for 10 minutes under the conditions of an oxygen flow rate of 100 sccm and a RF power of 100 (to 300) mW.

Figure 5C:
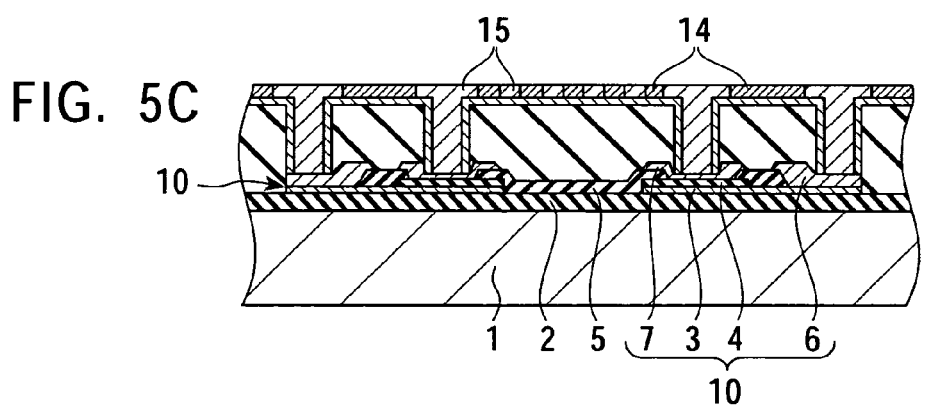

Then, as shown in FIG. 5C, the conductive layer 15 is deposited by an electroplating process using the resist pattern 14 as a mask to form the plugs 16, the lands 17, the wiring 18 and the inductor 20. The wiring part 18 is formed to a thickness of, for example, about 5 μm.

Electroplating is performed, for example, under the following conditions:

Washing: immersion in a bump cleaner for 30 minutes, water-washing for 1 minute, immersion in a 5% sulfuric acid aqueous solution for 30 seconds, and then water-washing for 1 minute:
Degreasing: at 40° C. for 1 minute;
Wetting: at 40° C. for 2 minutes;
Pickling and water washing: for 1 minute
Copper sulfate plating solution: solution temperature; 25° C., copper sulfate concentration; 50 g/l, sulfuric acid concentration; 25 g/l;
Brightening: Cu Bright VF-2 (trade name of Ebara Corporation) (a mixture of 20 cm³/l of liquid A and 10 cm³/l of liquid B); and
DK (cathode current density): 0.03 A/cm²

Figure 5D:
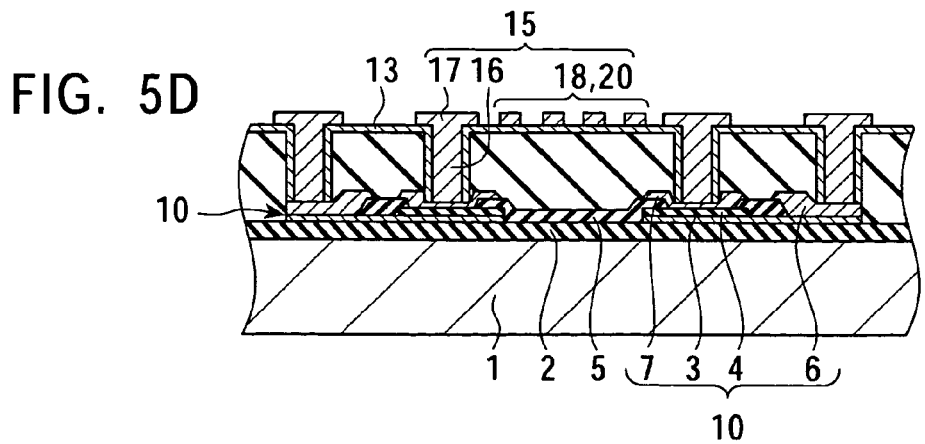

After electroplating, as shown in FIG. 5D, the resist 14 is removed, and the residual resist is removed by ashing. For example, the resist is separated by using an alkali solution, and then the residue is removed by ashing using a plasma ashing apparatus in a flow of tetrafluoromethane $CF_4$ and oxygen at a flow rate of 50 sccm each with a RF electric power of 25 W applied. This ashing treatment is repeated two times for 5 minutes each.

Figure 6A:
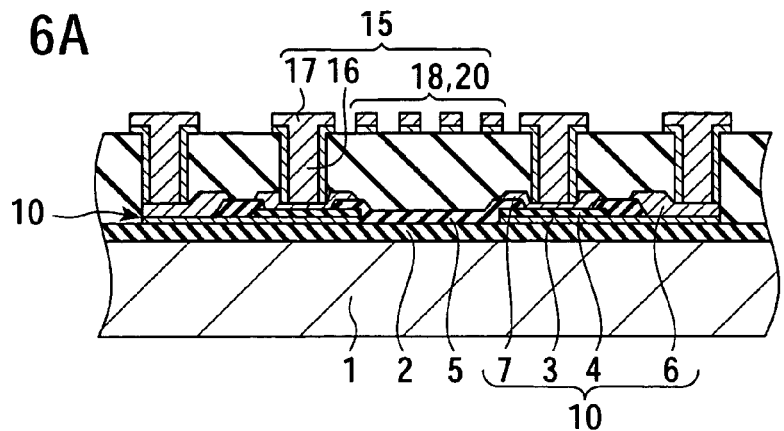
FIGS. 6A to 6E are schematic sectional views showing steps for manufacturing the SiP.

Next, light etching is preformed for removing an oxide film on the surface of the conductive layer 15. Then, the seed layer 13 (a copper film and a titanium film) is removed from portions other than the portion below the conductive layer 15 by using the conductive layer 15 as a mask to form the inductor 20 and the lands (connecting terminals) 17 (FIG. 6A).

Each of the layers is etched off by, for example, a wet etching apparatus under the following conditions:

<Light Etching of Oxide Film>
Hydrofluoric acid is used as a chemical.

<Copper Film>
The substrate 1 is washed by spraying a chemical SO—YO (produced by Kanto Kagaku Co., Ltd.) on the substrate 1 while rotating it at 50 rpm for 15 seconds. Next, pure water is sprayed (rinse) on the substrate 1 rotated at 500 rpm for 60 seconds. Next, the substrate 1 is rotated at 3000 rpm for 30 seconds to shake off water for drying (spin drying).

<Titanium Film>

The substrate 1 is washed by spraying a chemical SO-1 (produced by Kanto Kagaku Co., Ltd.) on the substrate 1 while rotating it at 50 rpm for 25 seconds. Next, pure water is sprayed (rinse) on the substrate 1 rotated at 500 rpm for 60 seconds. Next, the substrate 1 is rotated at 3000 rpm for 30 seconds to shake off water for drying (spin drying).

[Thinning of IC Chip]

The IC chip 30 to be mounted on the silicon substrate 1 is separately prepared. Since the IC chip 30 is buried in a resin layer, it is necessary to thin the chip by grinding an IC substrate, as shown in FIGS. 6B to 6E. Thinning is preferably performed before a wafer having the IC chips 30 formed thereof is divided into individual chips.

Figure 6B:
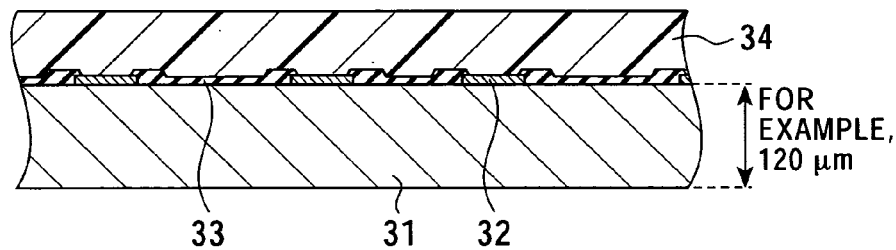

First, as shown in FIG. 6B, a back grind protective tape 34 serving as a substrate for thinning is bonded to the surface of an IC substrate (wafer) 31 having the IC chips 30 formed thereon by a known method. Since the protective tape 34 has an adhesive layer, the protective tape 34 is bonded by a pressure roller without heating. For example, a non-ultraviolet curing support type having a total thickness of 265 µm can be used. As the IC substrate 31, for example, a silicon substrate or a gallium arsenide substrate can be used.

Figure 6C:
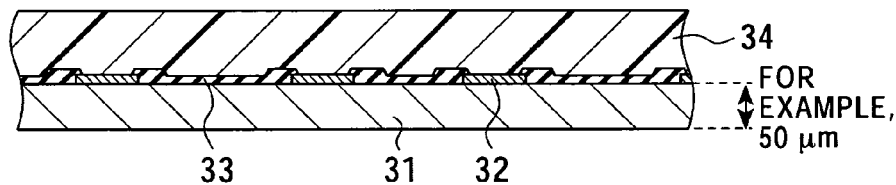

After the protective tape 34 is bonded, the IC substrate 31 is ground to a finish thickness of 50 µm with two types of grindstones having different degrees of roughness for rough grinding and finish grinding, respectively (FIG. 6C).

For example, when the substrate 31 is a gallium arsenide substrate, the substrate 31 is roughly ground with a grindstone of #600 at a spindle rotational speed of 3000 rpm, and then finish-ground with a grindstone of #2000 at a spindle rotational speed of 3000 rpm to decrease the thickness of the IC substrate 31 by 70 µm from the initial thickness of 120 µm.

Figure 6D:
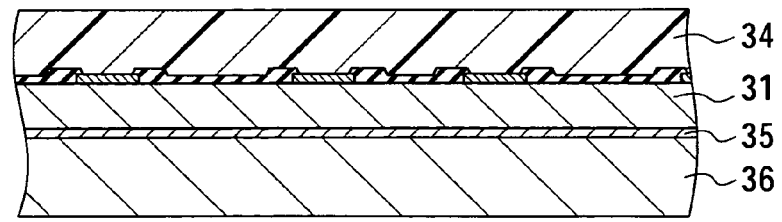

Next, as shown in FIG. 6D, a die attach film (DAF) 35 and a dicing sheet 36 are bonded to the back surface of the IC substrate 31 thinned to a thickness of 50 µm. The DAF 35 and the dicing sheet 36 are integrated to a structure in which the three layers including the die attach film 35 (thickness of 10 µm to 50 µm), an adhesive layer (not shown in the drawing) (thickness of 5 µm), and the dicing sheet 36 (thickness of 100 µm) comprising, for example, polyolefin, are laminated. The die attach film (DAF) 35 and the dicing sheet 36 are bonded by a manual method or an automatic machine.

In the use of an automatic machine, the bonding conditions are as follows:

Automatic bonding machine: PM-8500 (produced by Nitto Denko Corporation);
Temperature: 40° C.;
Pressure: 15 N/cm$^2$; and
Lamination rate: 10 mm/sec.

Figure 6E:
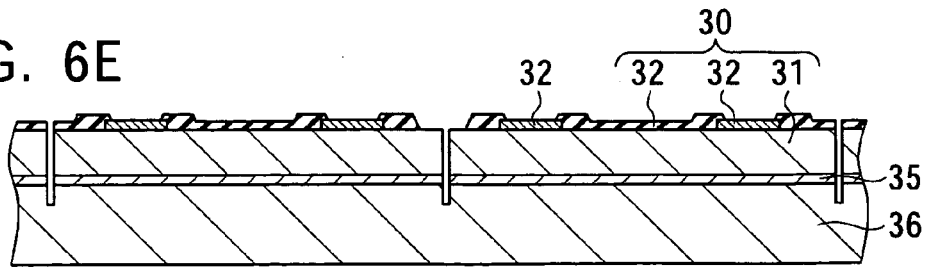

Next, dicing is performed to dividing into the IC chips 30. In tape cut dicing of the IC chips 30 integrally bonded to the dicing sheet 36 as described above, the IC chips 30 are bonded on a dicing ring under the above conditions, the back grind protective tape 34 is removed, and then full-cut dicing is preformed (FIG. 6E).

Dicing is performed under the following conditions according to the material of the IC substrate (wafer) 31.

<Cutting of a Silicon Substrate of 50 µm in Thickness>
Blade: 2050 27 HECC (produced by DISCO Corporation);
Spindle rotational speed: 3000 rpm; and
Feed rate: 30 mm/sec.

<Cutting of a Gallium Arsenide Substrate of 50 µm in Thickness>
Blade: ZH126F (produced by DISCO Corporation);
Spindle rotational speed: 3000 rpm;
Feed rate: 5 mm/sec; and
Cutting depth: 40 to 85 µm.

[Mounting of the IC Chip on the Substrate]

Figure 7A:
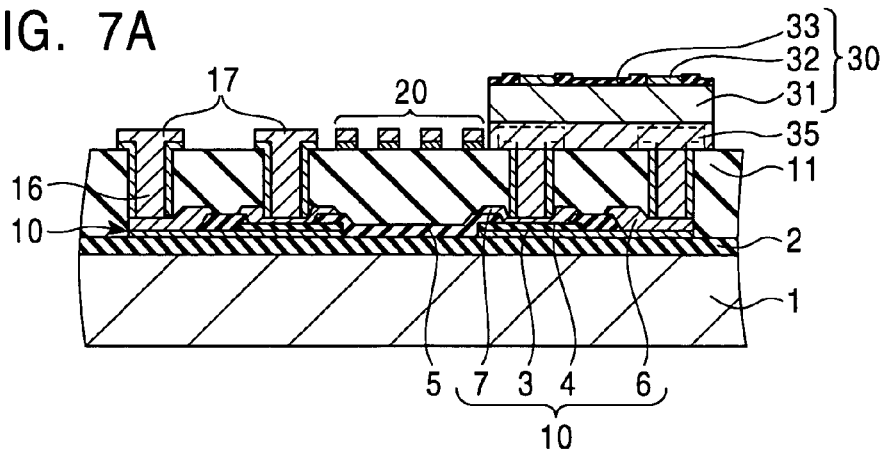
FIGS. 7A to 7C are schematic sectional views showing steps for manufacturing the SiP.

Next, the IC chip 30 thinned and divided is separated from the dicing sheet and mounted on the silicon substrate 1 (FIG. 7A). In this step, the DAF 35 is used as an insulating adhesive for bonding the IC chip 30 to the insulating layer 11.

Pickup from the dicing sheet is performed under the following conditions:

<Using a Needle>
Plunge-up rate: 80 to 100 mm/sec;
Pick-up retention time: 10 to 50 msec;
Pickup lift: 400 µm; and
Expand: 5 µm (minimum).

<Needleless>
Stroke: 3000 µm; and
Speed: 10 mm/sec.

Figures 1, 7B:
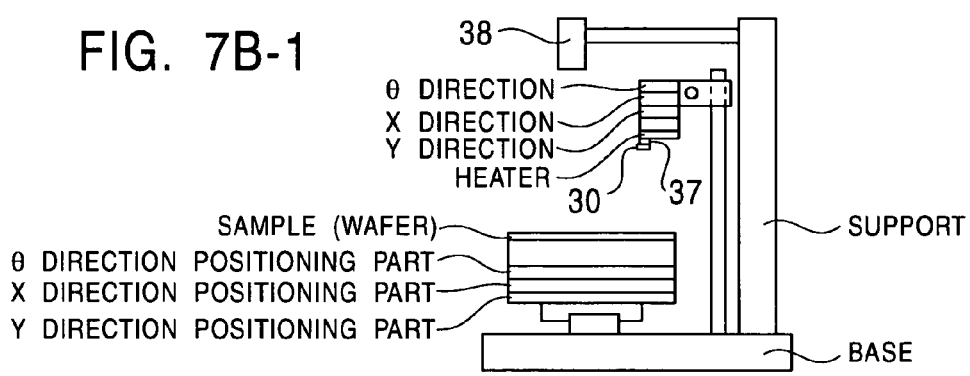
Figures 2, 7B:
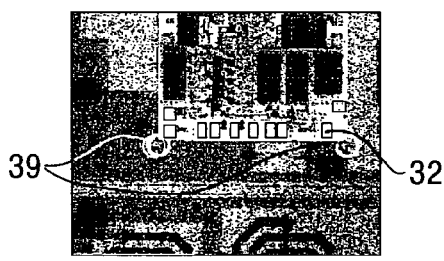

FIG. 7B is a drawing illustrating a method for fixing the IC chip 30 in a face-up state to the substrate 1 by die bonding with an accuracy of 5 µm. A tool 37 for picking up the IC chip 30 comprises ceramic. Bonding (mounting) is performed at a tool temperature of 110° C. with a load of 1N/die and a peel strength of 1 kgf or more per second. The accuracy of bonding to the silicon substrate 1 is ±2.5 µm or less.

The method will be described in detail below. First, the IC chip 30 placed on an expanded wafer or a chip tray is inspected by pattern recognition to decide whether the IC chip 30 is a good product or a defective product. Only the IC chip 30 decided as a good product is picked up by the tool 37.

As the coordinates for pickup, the alignment marks 39 previously formed on the substrate 1 and the positions of pads (electrodes) 32 of the IC chip 30 to be mounted are input. The tool 37 draws the IC chip 30 at a position offset to a direction by about 100 to 500 µm from the pads (electrodes) 32. As a result, alignment between the substrate 1 and the IC chip 30 can be performed in a state in which the alignment marks 39 on the substrate 1 and the pads (electrodes) 32 are brought in the visual field of a CCD camera 38.

Figures 3, 7B:
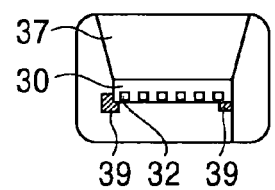

More specifically, in the vicinity of a horizontal mounting position of the IC chip 30, the tool 37 drawing the IC chip 30 is moved downwardly to a position near a vertical mounting position in the vertical direction by using the apparatus shown in FIG. 7B-1. At this position, the alignment marks 39 of the substrate 1 and the positions of the pads (electrodes) 32 of the IC chip 30 are measured as shown in FIGS. 7B-1 and 7B-3. After horizontal alignment, the tool 37 is further moved downwardly to press-bond the IC chip 30 to the substrate 1, and then the IC chip 30 is completely mounted on the substrate 1 under pressure and heating.

In this step, the camera field has a rectangular shape of 480 µm in width and 640 µm in length, and pattern matching is performed by edge detection. A mounting accuracy of ±2.5 μm is achieved. For example, mounting conditions include 130° C. and 1 N/die. Heating is carried out only with a heater of the tool 37 to prevent oxidation of the copper wiring on the substrate 1. After mounting, the tool 37 is cooled to room temperature by nitrogen gas blowing.

[Burying of the IC Chip and Formation of an Electrode Extension]

Next, as shown in FIGS. 7C to 9A, the mounted IC chip 30 is buried in an insulating layer, and an extension of the IC electrodes 32 is formed. These steps are substantially the same as those shown in FIGS. 4C to 6A, and include a step of forming an insulating layer 21, a step of forming connecting holes 22, a step of forming a seed layer 23, a step of forming a resist pattern 24, and a step of forming a conductive layer 25 by electroplating.

Figure 7C:
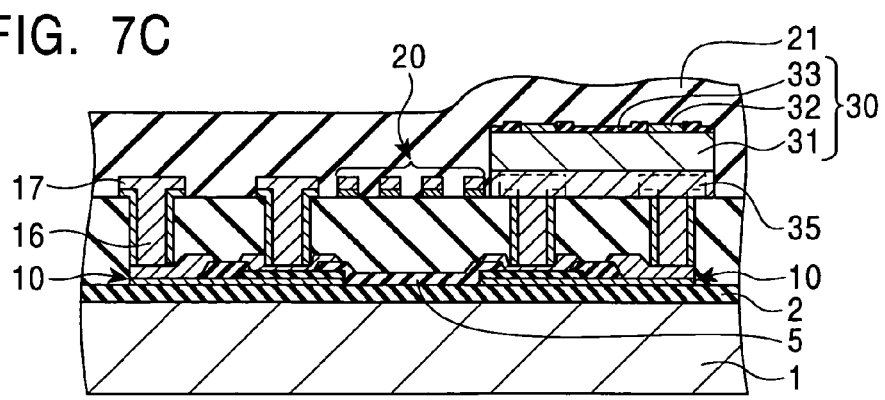

First, as shown in FIG. 7C, the insulating layer 21 is formed by a spin coating method, a printing method or a dispense method. As a result, the IC chip 30 is completely buried up to its top surface in the insulating layer 21. The coating conditions of the insulating layer 21 are the same as those for coating the insulating layer 11 on the silicon substrate.

The material of the insulating layer 21 is preferably a material with a low dielectric constant, for example, polyimide, polybenzoxazole, an epoxy resin, a polyamide imide resin, or the like.

For example, when the insulating layer 21 is formed by the spin coating method using photosensitive polyimide, the insulating layer 21 is formed under the following deposition conditions:

Viscosity of a coating solution: 200 P (poise);
Rotational speed of a spin coater: rotation at 800 rpm for 30 seconds, and then rotation at 1200 rpm for 30 seconds;
Pre-baking: heating at 60° C. for 240 seconds, heating at 90° C. for 240 second, and further heating at 110° C. for 240 seconds in a nitrogen gas atmosphere.

Figure 8A:
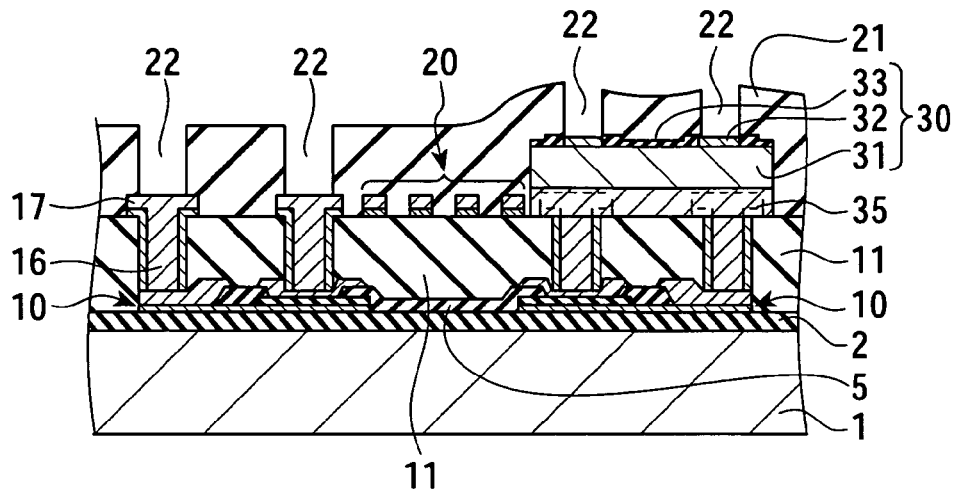
FIGS. 8A to 8C are schematic sectional views showing steps for manufacturing the SiP.

Next, as shown in FIG. 8A, the connecting holes 22 for extending the electrodes are formed, for example, in a size with a diameter of 50 μm in the insulating layer 21.

When the insulating layer 21 is formed by using photosensitive polyimide, the connecting holes 22 are formed by exposure and development under the following conditions:

Exposure: irradiation of broad-band light with 400 mJ/cm$^2$ in terms of i-line by using a stepper;
Development: spray development using a spin developer; J.E.T. (Just Exposure Time)×1.8;
Development test: using an inspection machine; and
Post-baking: heating at 150° C. for 0.5 hour and then heating at 250° C. for 2.0 hours in an atmosphere with an oxygen concentration of 40 ppm or less.

After development, a scum (residue) on the surface of the insulating layer 11 is removed. The scrum is removed, for example, by a plasma ashing apparatus for 10 minutes at an oxygen flow rate of 100 sccm with a RF power of 100 mW.

Figure 8B:
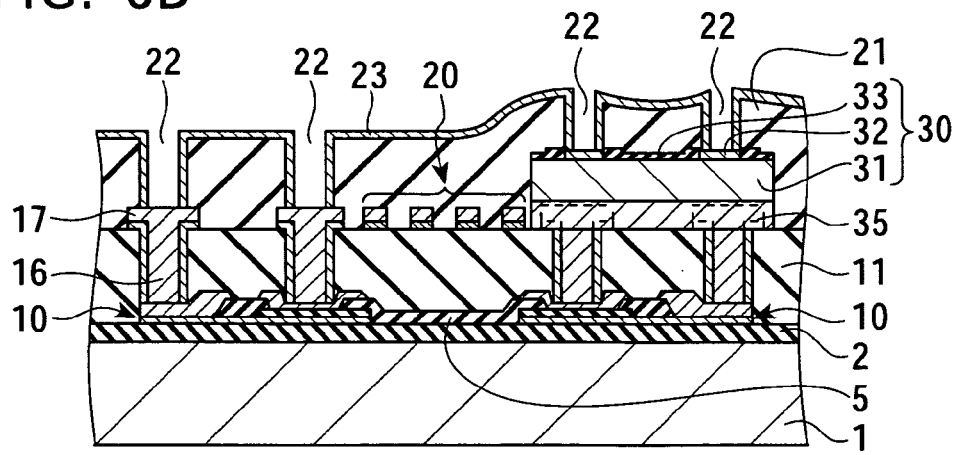

Next, as shown in FIG. 8B, a laminated film of a titanium film and a copper film is formed as the seed layer (underlying metal film) 23 by the sputtering method.

Sputtering is performed, for example, under the following conditions:

Thickness: a titanium film of 1600 Å in thickness is deposited, and then a copper film of 6000 Å in thickness is deposited on the titanium film;
Degree of vacuum: $3.6 \times 10^{-3}$ Pa;
Sputtering pressure: $6.1 \times 10^{-1}$ Pa;
Argon gas flow rate: 110 to 115 cm$^3$/min; and
Sputtering power: 2000 to 3000 W.

Figure 8C:
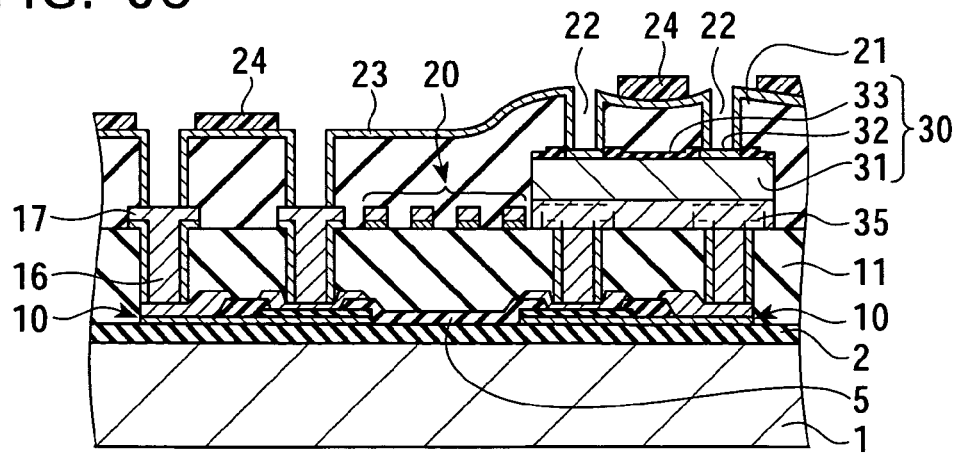

Next, a photoresist is coated and exposed in correspondence with a wiring pattern, and then development and removal of a scrum are performed to form a resist pattern 24 corresponding to the wiring pattern, as shown in FIG. 8C.

For example, the resist is coated by the spin coating method and developed under the following conditions to form the resist pattern 24.

Rotational speed of a spin coater: rotation for 10 seconds at 500 rpm, rotation for 30 seconds at 4000 rpm, further rotation for 0.5 second at 5000 rpm, and then gradual speed reduction to a stop over 3 seconds;
Pre-baking: heating at 110° C. for 30 seconds.
Exposure: using a stepper;
Development: using a developer P-7G as a spin developer in seven times of treatments each comprising rotating the substrate 1 at 50 rpm for 30 seconds while spraying the developer on the substrate 1 and then stopping the substrate 1 for 30 seconds.
Rinsing: spraying pure water on the substrate 1 for 60 seconds while rotating the substrate 1 at 500 rpm;
Spin drying: rotating the substrate 1 at 3000 rpm for 30 second to shake off water; and
Development test: using an inspection machine.

After the resist pattern 24 is formed, a scum on the surface is removed. The scum is removed by, for example, using a plasma ashing apparatus for 10 minutes at an oxygen flow rate of 100 sccm with a RF power of 100 mW.

Figure 9A:
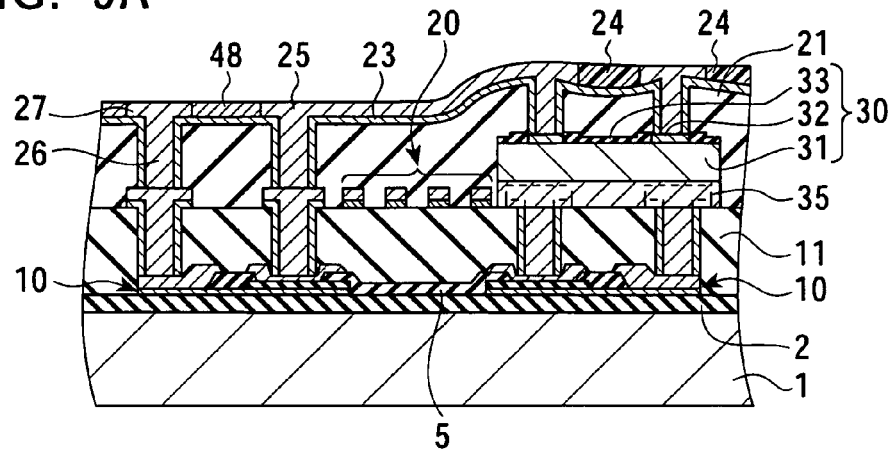
FIGS. 9A to 9C are schematic sectional views showing steps for manufacturing the SiP.

Then, as shown in FIG. 9A, the connecting holes 22 and the wiring pattern are filled with the conductive layer 25 by a copper electroplating method using the resist pattern 24 as a mask to form plugs 26, lands 27, and wiring. For example, each of the plugs 26 has a diameter of 50 μm, each of the lands has a diameter of 70 μm, and the wiring has a thickness of about 5 μm.

Electroplating is performed under the following conditions:

Washing: immersing in a bump cleaner for 30 minutes, water-washing for 1 minute, immersing in a 5% sulfuric acid aqueous solution for 30 seconds, and then water-washing for 1 minute:
Degreasing: at 40° C. for 1 minute;
Wetting: at 40° C. for 2 minutes;
Pickling and water washing: for 1 minute
Copper sulfate plating solution: solution temperature; 25° C., copper sulfate concentration; 50 g/l, sulfuric acid concentration; 25 g/l; and
DK (cathode current density): 0.03 A/cm$^2$ After electroplating, the resist 24 is removed, and a resist residue is removed by ashing. For example, the resist layer 24 is separated with an alkali liquid, and then the residue was removed by ashing using a plasma ashing apparatus and tetrafluoromethane CF$_4$ and oxygen at a flow rate of 50 sccm each with a RF electric power for 25 W applied. The ashing is repeated two times for 5 minutes each.

[Formation of the Buffer Layer and the External Connecting Electrode]

Next, as shown in FIG. 9B to FIG. 11A, the copper posts 43 for extending the external connecting electrodes and the insulating layer 44 for evenly covering the other portions are formed as the buffer layer for improving the reliability of connection to a RF-4 mother substrate or the like, and the external connecting electrodes 45 are formed on the exposed surfaces of the copper posts 43.

Figure 9B:
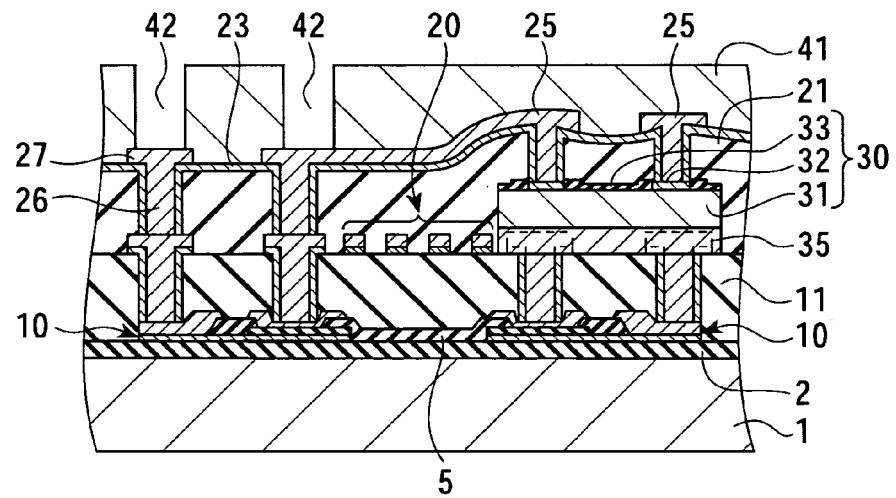

First, an oxide film on the surface of the conductive layer 25 is removed by light etching with hydrofluoric acid, and then a photosensitive dry film (resist film) 41 is bonded. The resist film 41 is partially exposed through a mask, and then a cover film is separated. Then, development and scum removal are performed to holes 42 in the resist film 41 in correspondence with the copper posts 43 (FIG. 9B).

Figure 9C:
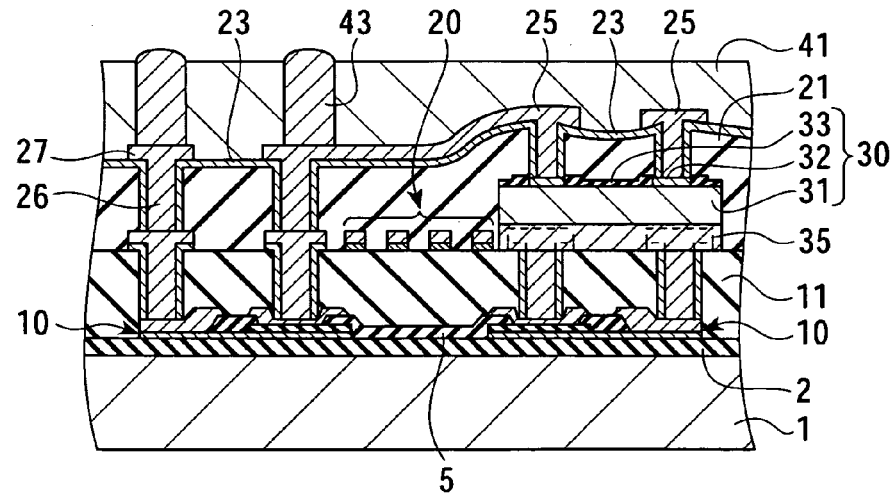

Then, as shown in FIG. 9C, the holes 42 are filled with copper by electroplating using the resist film 41 as a mask to form the copper posts 43 having a diameter of 150 µm and a height of 100 µm, for example.

Figure 10A:
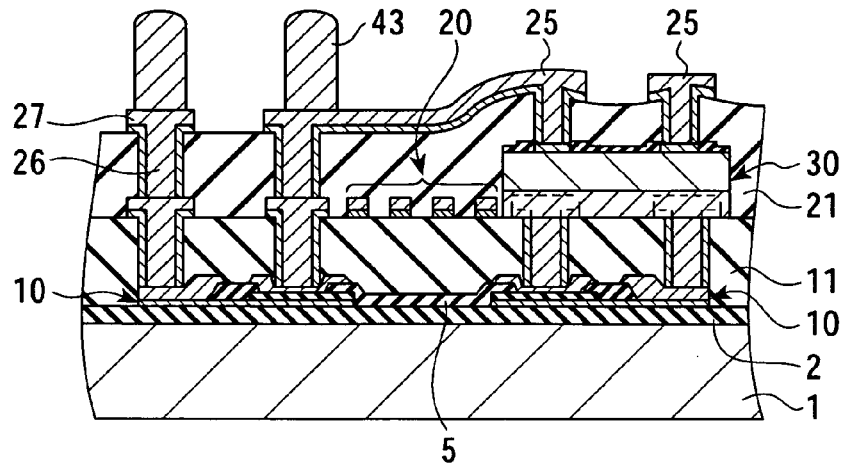
FIGS. 10A to 10C are schematic sectional views showing steps for manufacturing the SiP.

Next, as shown in FIG. 10A, the dry film 41 is separated, and then portions of the seed layer 23 except the portions below the conductive layer 25 are etched off by using the conductive layer 25 as a mask to form the plugs 26, the lands 27 and the wiring comprising the conductive layer 25.

The copper film and the titanium film of the seed layer 23 are removed by a wet etching apparatus under the following conditions:

<Copper Film>

The substrate 1 is washed by spraying a chemical SO—YO on the substrate 1 while rotating it at 50 rpm for 15 seconds. Next, pure water is sprayed (rinse) on the substrate 1 rotated at 500 rpm for 60 seconds. Next, the substrate 1 is rotated at 3000 rpm for 30 seconds to shake off water for drying (spin drying).

<Titanium Film>

The substrate 1 is washed by spraying a chemical SO-1 on the substrate 1 while rotating it at 50 rpm for 25 seconds. Next, pure water is sprayed (rinsing) on the substrate 1 rotated at 500 rpm for 60 seconds. Next, the substrate 1 is rotated at 3000 rpm for 30 seconds to shake off water for drying (spin drying).

Figure 10B:
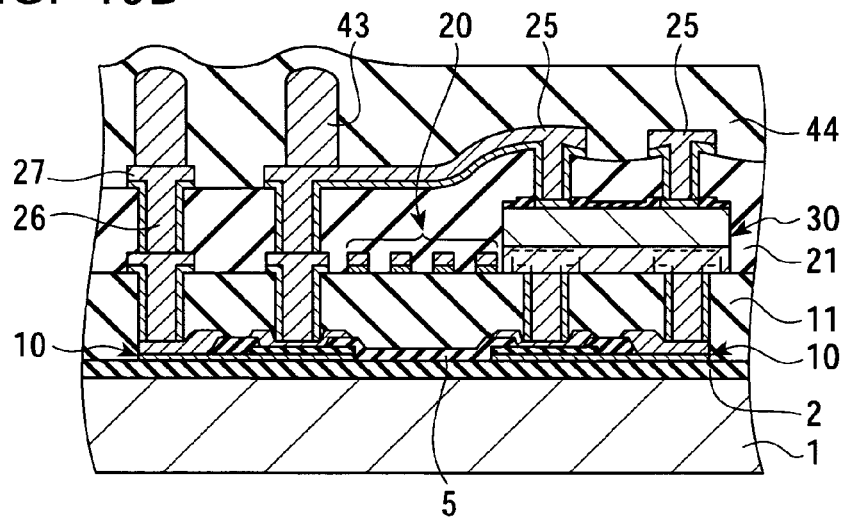

Next, as shown in FIG. 10B, with the copper posts 43 in a standing position, the insulating layer 44 comprising an epoxy resin, PBO, PI or a phenol resin is formed by a spin coating method, a printing method or a transfer molding method to completely cover the copper posts 43. The insulting layer 44 is degassed in a vacuum oven, and then cured at 120° C. for 1 hour and then at 150° C. for 2 hours.

In this step, for example, when the insulating layer 44 is deposited by the printing method, the top surfaces of the copper posts 43 is covered with the insulating layer 44 with a thickness of 10 µm or more by squeeging to finish the insulating layer 44 to a surface roughness of ±30 µm or less.

Figure 10C:
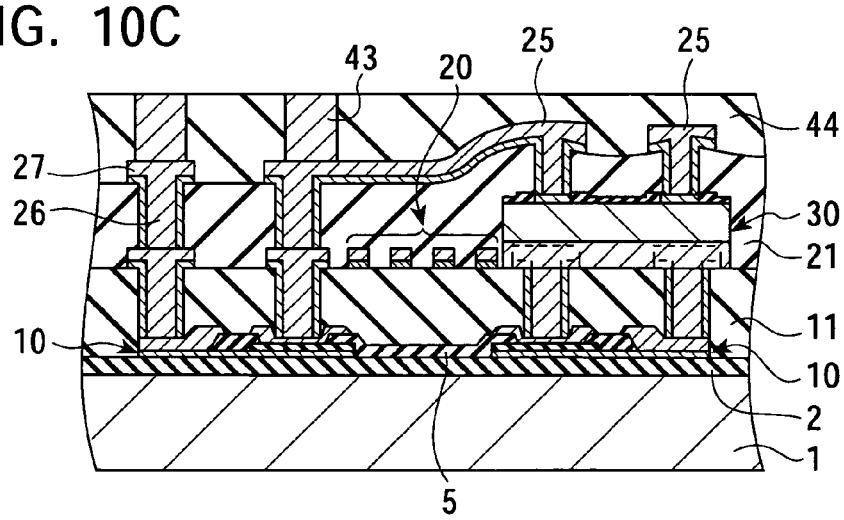

After the resin is cured, the surface is ground to expose the tops of the copper posts 43, as shown in FIG. 10C. This step is performed by grinding with, for example, a grindstone of #600 at a spindle rotational speed of 3000 rpm.

Figure 11A:
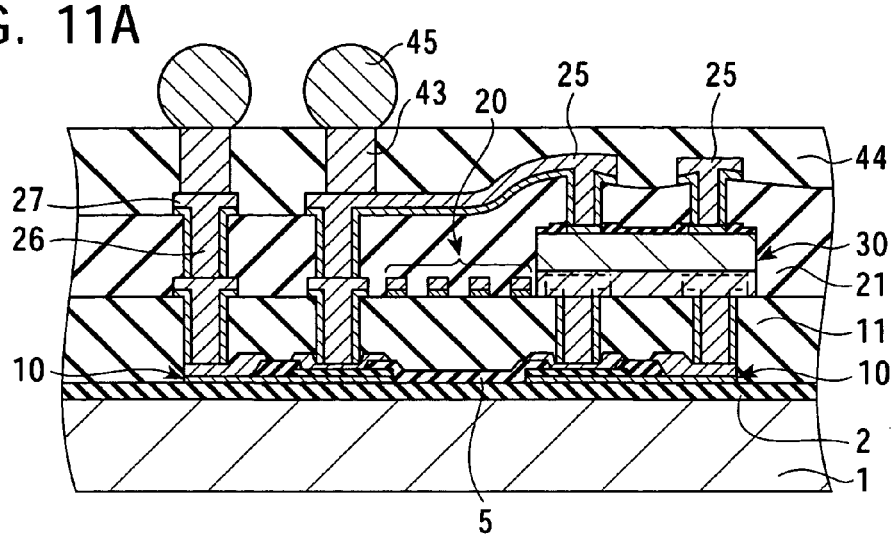
FIGS. 11A to 11C are schematic sectional views showing a step for manufacturing the SiP.

Next, as shown in FIG. 11A, the exposed portions of the copper posts 43 are activated, and the external connecting electrodes 45 are formed on the copper posts 43. As each of the external connecting electrodes 45, a solder ball bump, a lead-free solder ball bump, an Au stud bump, a LGA, or a printed bump is formed.

For example, when solder balls are formed, as shown in FIG. 11A, a flux is coated, and then solder balls of about 0.15 mm in diameter are adhered and melt-boned by reflowing. After bonding, the flux is washed off to complete the external connecting electrodes 45.

In this package, the external connecting electrodes 45 are arranged in correspondence with an area array type or peripheral type BGA or LGA.

[Thinning of the Package and Dividing into Pieces]

After the external connecting electrodes 45 are formed, the package is thinned and divided into pieces.

Figure 11B:
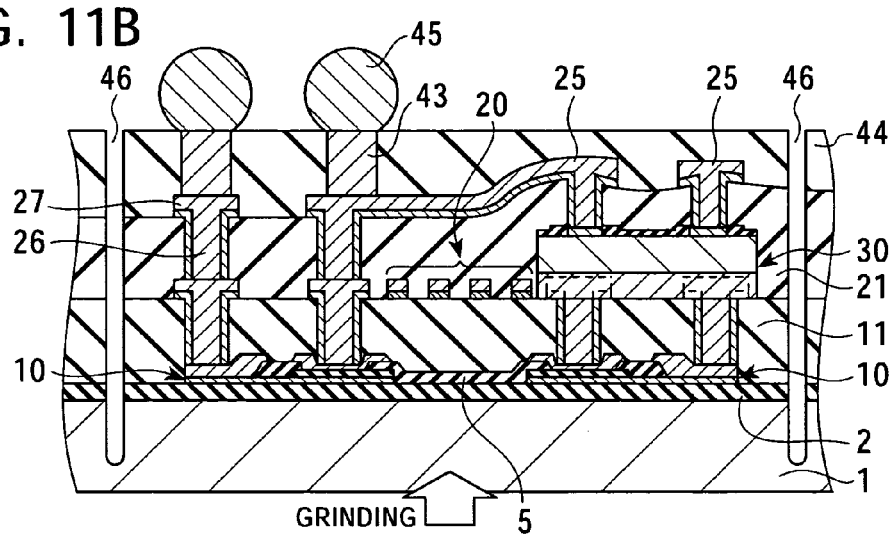

First, as shown in FIG. 11B, the silicon substrate 1 is half-cut. In this step, cut grooves 46 of 70 µm in depth are formed in the silicon substrate 1 by grinding with a grindstone #1500 at a spindle rotational speed of 3000 rpm.

Figure 11C:
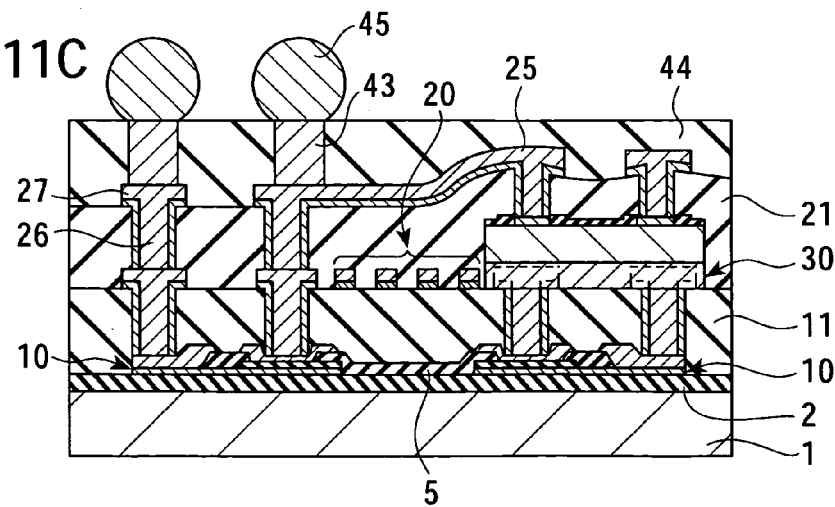

After half-cutting, the back surface of the silicon substrate 1 is ground to simultaneously thinning the silicon substrate 1 and dividing it into pieces. In this step, a back grind protective tape is bonded to the surface side of the silicon substrate 1, and the silicon substrate 1 is ground to a thickness of, for example, 50 µm, by rough grinding with a grindstone #360 at 4800 rpm and then finish grinding with a grindstone #600 at 5500 rpm. Then, the background protective tape is separated, and the individually divided pieces are bonded to a transfer film to completely divide into SiPs 50 (FIG. 11C).

[Mounting of Two or more Stacked IC Chips]

As shown in FIGS. 2, 3A and 3B, when two or more IC chips are stacked and mounted, and particularly when the thickness is limited, each IC chip is ground to, for example, 25 µm, by a grinder to further thin the IC chip, and then mounted.

Modified Example 1

In order to amount the lower IC chip 30A in a face down state, as shown in FIG. 2, the substrate-side electrodes 8 to be bonded to the electrodes 32A of the IC chip 30A are formed on the protective layer 5 during the formation of the electrodes 6 and 7 of the capacitor 10. On the other hand, a Ni/Au, UBM, or Au stud bump or a solder bump for bonding is formed on each of the electrodes 32A of the IC chip 30A. Then, the silicon substrate 1 is aligned with the IC chip 30A, and the substrate-side electrodes 8 and the electrodes 32A are bonded together by heating under pressure.

The IC chip 30B is press-bonded to the IC chip 30A with the DAF provided on the electrode surface of the IC chip 30B at the back surface thereof, and fixed face up. This step is performed by heating at a temperature of 130° C. for 1 second with a load of 1 N/die.

Electric connection to the IC chip 30B mounted face up is formed by the basic method of the above-described embodiment in which one IC chip is mounted. Namely, the insulating layer 11 is formed to cover the IC chip 30B and bury it therein, and plugs are formed to pass through the insulating layer 11, for extending the IC electrodes 32B to the upper surface. Furthermore, the wiring 18 is formed on the surface of the insulating layer 11 to be electrically connected to the plug.

Modified Example 2

As shown in FIGS. 3A and 3B, when the IC chips 30A and 30B are mounted in a face up state, X, Y and Z-direction deviations between the chips and an inclination θ between the chips must be decreased. Also, the gap between the chips must be filled with a resin which little causes a step and air bubbles in the gap.

In this case, electric connection to the upper IC chip 30B is performed by the basic method described in the above embodiment. Namely, plugs are formed in an insulating layer which covers the IC chip 30B to be connected to electrodes, and a conductive layer is formed on the surface of the insulating layer.

When wiring to be connected to the IC chip 30A need not be separately provided, electric connection to the lower IC chip 30A is formed together with the electric connection to the upper IC chip 30B, as shown in FIG. 3B. When wiring to be connected to the IC chip 30A must be separately provided, as shown in FIG. 3A, the intermediate insulating layer 28 is formed to partially cover the lower IC chip 30A, and the plug connected to the IC electrode 32A and the intermediate conductive layer 25A on the surface of the intermediate insulating layer 28 are formed by the same method as the basic method of the embodiment using the intermediate insulating layer 28.

Package Structure of SiP

Figure 12A:
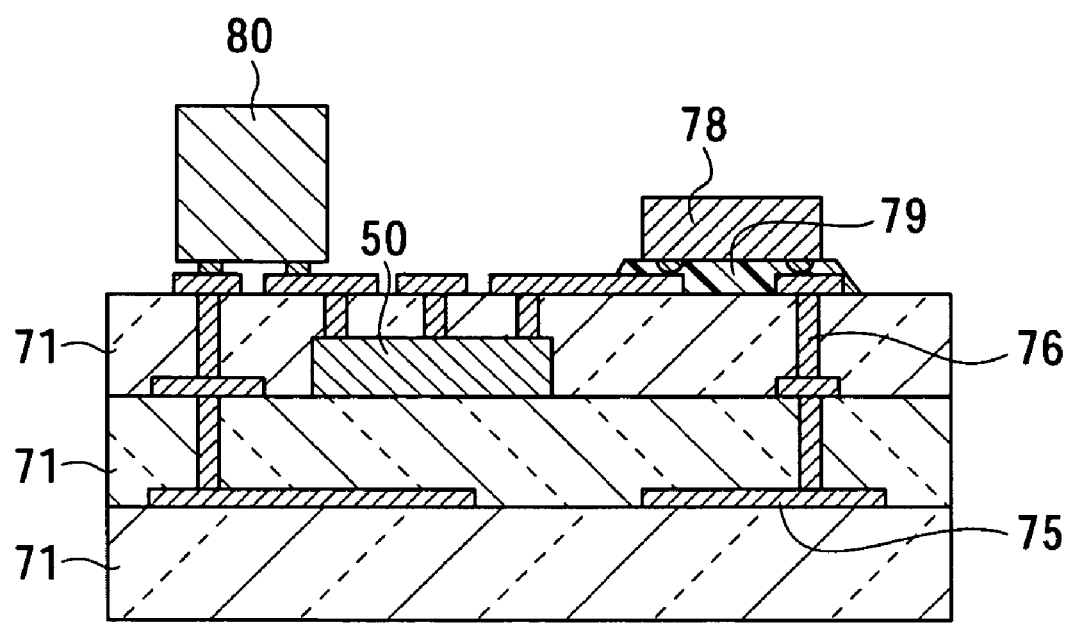
FIGS. 12A and 12B are schematic sectional views showing an example of mounting of the SiP.
Figure 12B:
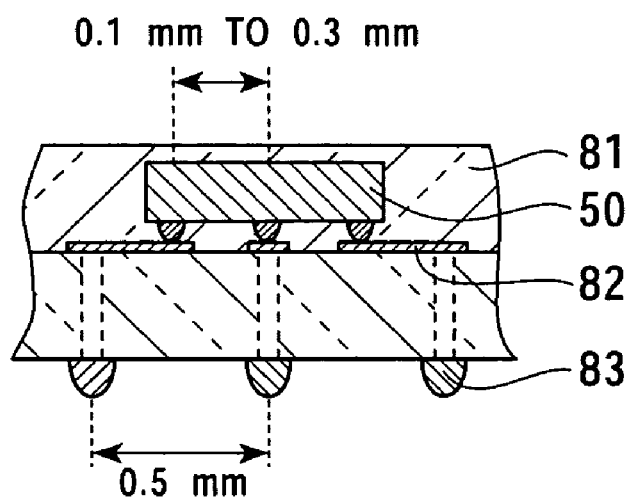
Figure 13:
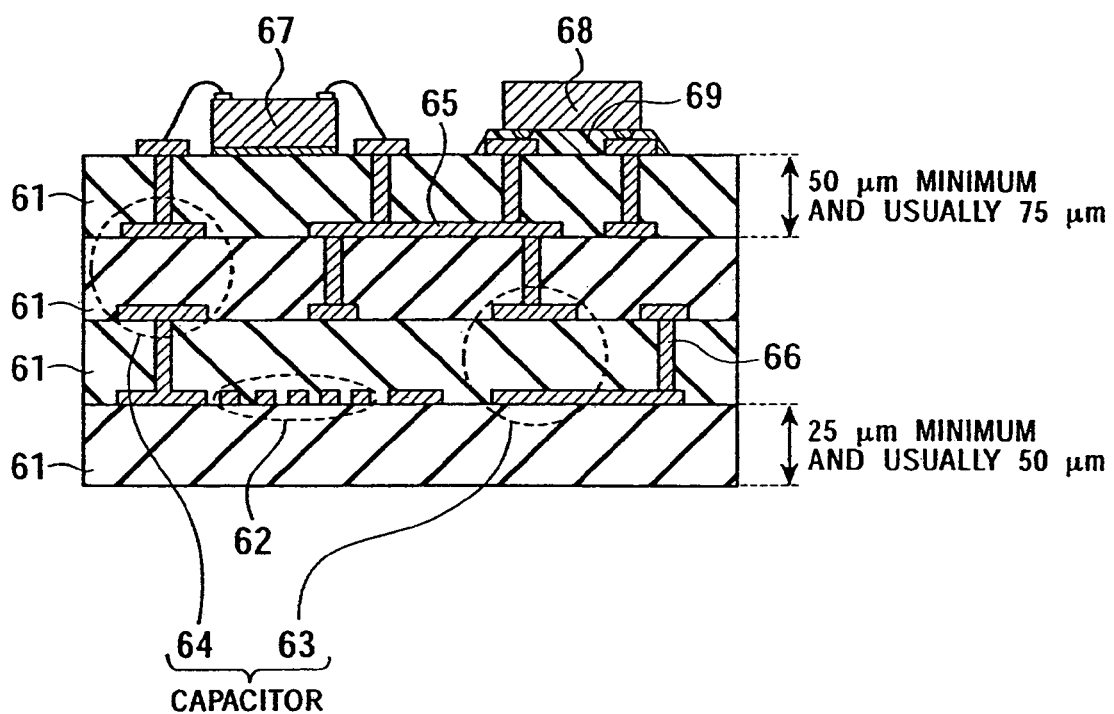
FIG. 13 is a schematic sectional view showing an example of a system in package for RF using a conventional LTCC substrate.
Figure 14A:
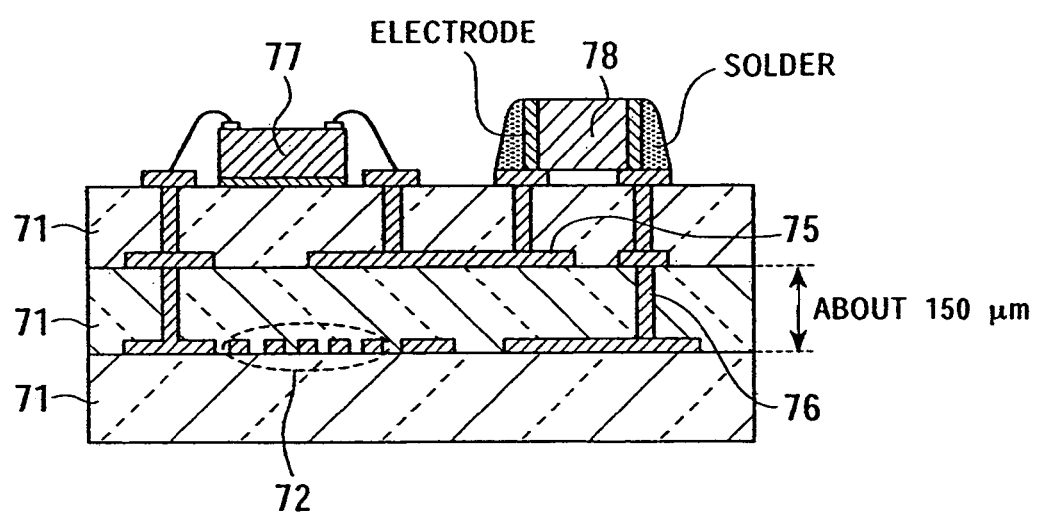
FIGS. 14A and 14B are schematic sectional views showing an example of a system-in package for RF using a conventional FR-4 glass epoxy substrate.
Figure 14B:
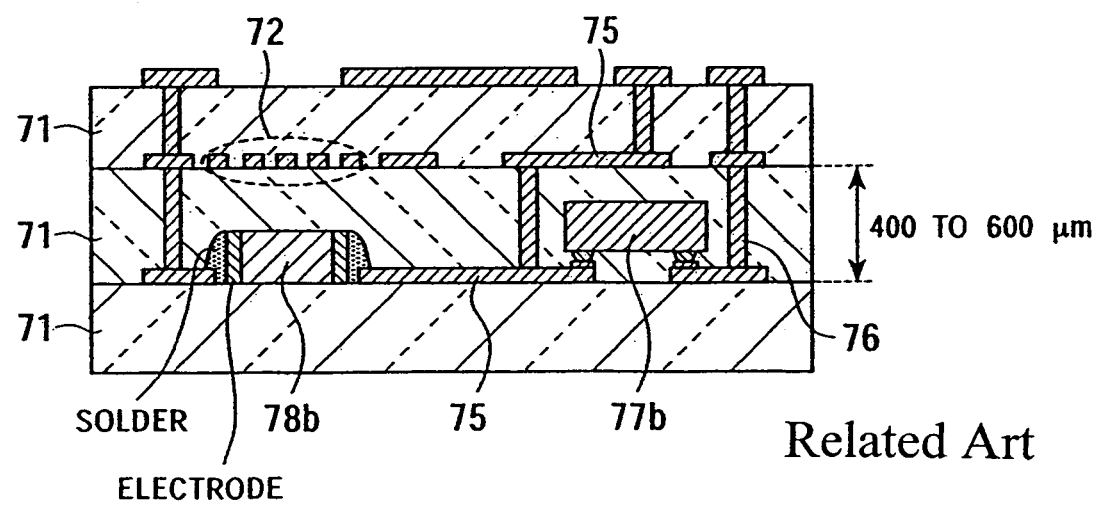

FIGS. 12A and 12B are schematic sectional views showing a package structure of SiP.

FIG. 12A shows an example in which the SiP 50, together with another semiconductor chip 78 and a quartz oscillator 80, is mounted on a RF-4 standard glass epoxy substrate. Although the SiP 50 is buried in a glass epoxy substrate 71, an element which cannot be incorporated into the SiP or which is advantageous to incorporation into the SiP, for example, a quartz oscillator, is preferably mounted on the glass epoxy substrate. In this way, the SiP 50 can be mounted together with another semiconductor chip and a functional component, to realize a higher functional apparatus.

FIG. 12B shows an example in which the SiP 50 is buried in an interposer layer 81 to be mounted. In this drawing, the electrode pitch (0.1 to 0.3 mm) of the SiP 50 and the electrode pitch (0.5 mm) of an external apparatus can be controlled by rearrangement wiring using the interposer layer 81. Therefore, even when the internal wiring width and wiring pitch of the SiP are decreased to miniaturize the SiP, the arrangement of external connecting electrodes 83 has a degree of freedom, and the number of the pins provided (the number of the external terminals) can be increased.

As described above, in the embodiment of the present invention, a passive element and a face-up active element are mounted on a silicon substrate, and each of these elements is covered with and buried in an insulating layer. In this case, conductor plugs can be formed in the insulating layer to pass therethrough in the thickness direction, for extending electrodes of the elements, and necessary wiring can be formed on the insulating layer.

As described above, a structure permitting flip chip mounting and face-up mounting permits three-dimensional mounting of the elements with a high density, and can improve the degree of design freedom of the entire SiP. Also, a capacitor and an IC part can be formed adjacent to each other on a silicon substrate, thereby realizing an improvement in radio-frequency properties.

In fixing an IC chip on a substrate, the IC chip is positioned by observing both the alignment marks formed on the substrate or the insulating layer and the electrodes of the IC chip in the same visual field of, for example, a CCD camera. Therefore, the IC chip can be fixed in a face up state with a mounting accuracy of ±2.5 μm.

When a plurality of IC chips is mounted, each IC chip is thinned by grinding to permit mounting of many IC chips without changing the thickness of the whole SiP, thereby facilitating the achievement of multiple functions.

Also, a silicon substrate is used as the substrate, and thus mechanical strength, heat resistance, thermal conductivity and the like are excellent. Furthermore, the techniques and apparatuses accumulated in the long history of semiconductor processing can be utilized to permit the effective manufacture at low cost. For example, a large wafer with excellent flatness can be obtained, and thinning can easily made by grinding. Also, a micro pattern can easily be formed on a wafer by a batch process using a semiconductor processing technology to effectively form wiring having small width and pitch and to change electrode positions by reprocessing. This enables the miniaturization of the whole SiP. Furthermore, if required, the silicon substrate is not simply used as the substrate, but the active element such as a transistor or the like can be formed on the substrate by a conventional method and incorporated into a SiP.

Since photosensitive polyimide is used as a material for the insulating layer, the insulating layers have excellent heat resistance and mechanical strength, and excellent electric properties such as a low dielectric constant, high insulation performance, and the like. Furthermore, each of the insulating layers comprising photosensitive polyimide can easily be patterned by exposure and development.

The resultant SiP can be buried in a FR-4 substrate or the like to permit the formation of a higher multifunctional SiP.

Of course, the conditions and apparatuses used in the above-described embodiment of the present invention can be appropriately changed within the scope of the gist of the present invention.

In the present invention, each of a face-up active element and passive element is covered with an insulating layer formed on a substrate, and the active element and/or the passive element is connected to wiring formed on the insulating layer. Therefore, each of the active element and the passive element can be buried in the insulating layer while forming a necessary electric connection, and a plurality of the insulating layers can be stacked by using, for example, the adhesive force between the insulating layer to form an insulating layer. As a result, a semiconductor device having a desired function and as small a thickness as possible can be packaged by protecting with an insulating layer.

Namely, the various functions of the insulating layers, i.e., the function to adhere a conductor to a surface or a through hole surface and to form the active element or the wiring, the function to cover the active element and the passive element to maintain these elements at predetermined positions while protecting the elements from the mechanical, chemical or electrical adverse effect of the outside, the function to easily form a thin film and easily form a laminated structure only by the adhesive force between the respective insulating layers, and the like, can be sufficiently utilized. Thus, the function to package the elements with a high density and protect the elements, which is conventionally served by a circuit board and a molding resin, can be realized only by the insulating layers. Therefore, the semiconductor device of the present invention becomes a small, thin, lightweight and inexpensive SiP. Also, the active element is held in a face up state, and thus any desired wiring having a small width and pitch can be formed on the insulating layers. Therefore, the degree of design freedom can be increased, and the number of the insulating layers laminated can be increased to facilitate the formation of a multifunctional device containing various elements.

The manufacturing method of the present invention is capable of manufacturing the semiconductor device of the present invention with high reproducibility. The package structure of the present invention can facilitate mounting of the semiconductor device together with another electric component on a circuit board or the like.

What is claimed is:

1. A semiconductor device comprising:
a plurality of insulating layers provided on a substrate;

at least one face-up active element and at least one face-up passive element each of which is covered with one of the insulating layers;

wiring formed on one of the insulating layers;

wherein the active element and/or the passive element is connected to the wiring though said one of the insulating layers;

at least one external connecting electrode for each of the active elements and the passive elements, said external connecting electrode provided on the insulating layers disposed on the wiring; and a conductor plug formed on each external connecting electrode, wherein the wiring constitutes an inductance element.

2. The semiconductor device according to claim 1, wherein the wiring is formed on a lower insulating layer, and the external connecting electrode is formed on an upper insulating layer.

3. The semiconductor device according to claim 1, wherein the insulating layers has a connecting hole, and said conductor plug is formed in each connecting hole for connecting the active element and/or the passive element to the wiring.

4. The semiconductor device according to claim 1, wherein the insulating layers include a first insulating layer covering a first passive element, and a second insulating layer covering a second passive element and a semiconductor chip, the second insulating layer being formed on the first insulating layer.

5. The semiconductor device according to claim 1, wherein the insulating layers include a first insulating layer covering a first passive element and a semiconductor chip, a second insulating layer formed on the first insulating layer, and a third insulating layer covering a second passive element, the third insulating layer being formed on the second insulating layer.

6. The semiconductor device according to claim 1, wherein the insulating layers include a first insulating layer covering a first passive element, a second insulating layer covering a second passive element, the second insulating layer being formed on the first insulating layer, and a third insulating layer covering a semiconductor chip, the third insulating layer being formed on the second insulating layer.

7. The semiconductor device according to claim 1, wherein a plurality of semiconductor chips is stacked and fixed.

8. The semiconductor device according to claim 1, wherein the substrate is a silicon substrate.

9. The semiconductor device according to claim 1, wherein each of the insulating layers comprises a photosensitive polyimide.

10. A package structure of a semiconductor device, comprising the semiconductor device according to claim 1, the semiconductor device being buried in an insulating layer, and an external connecting electrode formed on the insulating layer.

11. The package structure of the semiconductor device according to claim 10, further comprising another functional component mounted on the insulating layer.

* * * * *